(12) United States Patent
Houis

(10) Patent No.: US 11,796,573 B2
(45) Date of Patent: Oct. 24, 2023

(54) CURRENT SENSOR SYSTEM

(71) Applicant: Melexis Technologies SA, Bevaix (CH)

(72) Inventor: Simon Houis, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/711,340

(22) Filed: Apr. 1, 2022

(65) Prior Publication Data
US 2022/0341971 A1 Oct. 27, 2022

(30) Foreign Application Priority Data

Apr. 18, 2021 (EP) ..................... 21169036

(51) Int. Cl.
*G01R 15/20* (2006.01)
(52) U.S. Cl.
CPC ................... *G01R 15/202* (2013.01)
(58) Field of Classification Search
CPC .............. G01R 33/0206; G01R 33/028; G01R 33/1215; G01R 33/038; G01R 15/202; G01R 15/207; G01R 19/00; G01R 15/00; G01R 19/16504
USPC .................... 324/251, 207.2, 117 H
See application file for complete search history.

(56) References Cited

U.S. PATENT DOCUMENTS

| 8,125,214 B1* | 2/2012 | Steingart ............ G01R 15/202 324/117 R |
| 9,176,170 B2 | 11/2015 | Racz |
| 11,561,268 B2* | 1/2023 | Dupre .................. G01R 33/022 |
| 2018/0038898 A1* | 2/2018 | Shimizu ................ G01R 33/07 |
| 2018/0180649 A1* | 6/2018 | Paci ..................... G01R 15/205 |
| 2020/0191834 A1* | 6/2020 | Bilbao De Mendizabal ............... G01R 15/207 |
| 2020/0191835 A1 | 6/2020 | Bilbao De Mendizabal et al. |
| 2021/0055131 A1* | 2/2021 | Dupre ..................... G01B 7/30 |
| 2021/0088600 A1 | 3/2021 | Hoegerl et al. |

FOREIGN PATENT DOCUMENTS

| EP | 3109658 A1 | 12/2016 |
| EP | 3885779 A1 | 9/2021 |
| JP | H052033 A | 1/1993 |

OTHER PUBLICATIONS

Extended European Search Report from corresponding EP Application No. 21169036.7, dated Oct. 15, 2021.
Schneider et al., "Integrating Giant Magneto-Resistive (GMR) Field Detectors for High Bandwidth Current Sensing in Power Electronic Modules", Energy Conversion Congress and Exposition (ECCE), IEEE, Sep. 12, 2010, pp. 1260-1267.

* cited by examiner

*Primary Examiner* — Jermele M Hollington
*Assistant Examiner* — Robert P Alejnikov, Jr.
(74) *Attorney, Agent, or Firm* — WORKMAN NYDEGGER

(57) ABSTRACT

A current sensor system for measuring an AC electrical current, includes: a busbar having a beam shaped portion having a length and a width; a sensor device comprising two sensor elements spaced apart from each other in the width direction of the beam shaped portion. The sensor device is configured for measuring a magnetic field difference or a magnetic field gradient, and for determining the AC current based on said difference or gradient.

21 Claims, 26 Drawing Sheets

FIG 2(a) $|\Delta Bz(f)|$ as function of x, for f=100Hz to f=2000 Hz attenuation of $(\Delta Bz(f))$ relative to $(\Delta Bz)_{dc}$ at same position, as function of x, for various frequencies

FIG 2(b) phase shift of $(\Delta Bz(f))$ as function of x, for various frequencies dx=1.9mm; T=3mm; f=2kHz

| Width | 5 | 6 | 7 | 8 | 10 | (mm) |
|---|---|---|---|---|---|---|
| Aspect Ratio (W/T) | 1,67 | 2,00 | 2,33 | 2,67 | 3,33 | |

| Zs | 5 | 5 | 5 | 5 | 5 | (mm) |
|---|---|---|---|---|---|---|
| ds for 0% attenuation | 78 | 79 | 78 | 77 | 77 | % of W |
| ds for 0° phase shift | 81 | 81 | 80 | 79 | 79 | % of W |

| Zs | 4 | 4 | 4 | 4 | 4 | (mm) |
|---|---|---|---|---|---|---|
| ds for 0% attenuation | 75 | 75 | 75 | 75 | 75 | % of W |
| ds for 0° phase shift | 78 | 77 | 78 | 78 | 80 | % of W |

| Zs | 3 | 3 | 3 | 3 | 3 | (mm) |
|---|---|---|---|---|---|---|
| ds for 0% attenuation | 72 | 74 | 74 | 74 | 75 | % of W |
| ds for 0° phase shift | 75 | 76 | 78 | 79 | 82 | % of W |

FIG 5

CURRENT SENSOR SYSTEM

FIELD OF THE INVENTION

The present invention relates in general to the field of current sensors, and more in particular to magnetic current sensors.

BACKGROUND OF THE INVENTION

Different kinds of current sensors are known in the art, for example (1) current sensors using a shunt resistor, (2) using a current transformer, (3) or using a magnetic sensor.

In current sensors using a shunt resistor, a voltage is measured over the shunt resistor, and the current value can be determined by dividing the measured voltage value and the resistor value. A disadvantage of this type is that the measurement circuit is not electrically isolated from the load. A current transformer includes primary and secondary coils. While this type of current sensor provides galvanic separation, it is usually very bulky. Current sensors based on magnetic sensors provide both galvanic separation and can be very compact.

Known current sensors are typically designed to measure DC currents or low frequency currents, for example currents having a frequency of about 50 Hz or about 60 Hz.

Various electrical motor types exist, for example: so called DC brushed motors, DC brushless motors, AC brushless motors, linear motors, stepper motors, etc. In electrical vehicles, the following motor types are typically used: DC Series Motor, Brushless DC Motor, Permanent Magnet Synchronous Motor (PMSM), Three Phase AC Induction Motors, Switched Reluctance Motors (SRM).

Various electrical circuits for driving and/or controlling and/or monitoring electrical motors exist. In some of these circuits the actual currents provided to the motor need to be measured. These currents may have a magnitude of several tens or even hundreds of Amperes, and may have a frequency or frequency components up to several kHz. These currents are typically provided to the motor via so called "busbars". Busbars often come in the form of a metallic strip or bar, for example a copper bar.

It is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

It is a challenge to measure an AC current with high accuracy.

SUMMARY OF THE INVENTION

It is an object of embodiments of the present invention to provide a current sensor system and a method for measuring an AC current, in particular an AC current flowing through a busbar.

It is an object of embodiments of the present invention to provide a current sensor system and a method for measuring an AC current with improved accuracy.

It is an object of embodiments of the present invention to provide a current sensor system and a method for measuring an AC current with improved accuracy, in a simple manner.

It is an object of embodiments of the present invention to provide a current sensor system and a method for measuring an AC current having a frequency or having frequencies in the range from about 100 Hz to about 2000 Hz.

It is an object of embodiments of the present invention to provide a current sensor system and a method for measuring an AC current having a frequency or having frequencies in the range from about 100 Hz to about 2000 Hz with an absolute accuracy within ±5%, or an absolute accuracy within ±4%, or an absolute accuracy within ±3%, or an absolute accuracy within ±2%, or an absolute accuracy within ±1%.

These and other objects are accomplished by a current sensor according to embodiments of the present invention.

According to a first aspect, the present invention provides a current sensor system for measuring an AC electrical current, comprising: a busbar comprising a beam shaped portion having a predefined length (e.g. Lc) extending in a first direction (e.g. Y), and a predefined thickness in a second direction (e.g. Z), and a predefined width (e.g. Wp) in a third direction (e.g. X) perpendicular to the first direction; a sensor device comprising two sensor elements spaced apart by a predefined distance along the third direction, each sensor element being configured for measuring a magnetic field component (e.g. Bz1, Bz2) oriented in the second direction (e.g. Z); the sensor device being configured for determining a difference between these magnetic field components, and for determining said AC current based on said difference; wherein the sensor device is positioned relative to the busbar such that a reference point (e.g. R) of the sensor device situated in the middle between the two sensor elements is located at a first distance (e.g. Xs) measured in the third direction (e.g. X) from a symmetry plane (e.g. Ω) of the beam shaped portion, and is located at a second distance (e.g. Zs) from the busbar measured in the second direction (e.g. Z); wherein the predefined width (e.g. Wp) of the beam shaped portion is 2.0 to 4.0 mm or 2.2 to 3.8 mm; and wherein the predefined length (e.g. Lc) of the beam shaped portion is at least 4.0 mm, or at least 4.5 mm, or at least 5.0 mm, or at least 6 mm; and wherein the predefined distance (e.g. dx) between the two sensor elements is a value in the range from 1.0 to 3.0 mm, or from 1.5 to 2.5 mm; and wherein the second distance (e.g. Zs) is a value in the range from 0.5 mm to 4.0 mm; and wherein the first distance (e.g. Xs) is a value in the range from 0.0 mm to 3.0 mm.

The first direction is the direction in which the current mainly flows.

The "first direction" can also be referred to as "longitudinal direction". The "second direction" can also be referred to as the "height direction". The "third direction" can also be referred to as the "transverse direction".

The difference can also be referred to as "magnetic field difference (ΔBz)" or as "magnetic field gradient (dBz/dx) of the magnetic field component oriented in the second direction (Z), along the third direction (X).

In an embodiment the beam shaped portion of the busbar is situated between a second portion and a third portion of the busbar, wherein the width (e.g. Wp) of the beam shaped portion is smaller than the width (e.g. Wbb) of the second and the third portion, e.g. at least 2 mm smaller, or at least 4 mm smaller, or at least 6 mm smaller. The width of the busbar may change abruptly, or may change gradually, e.g. linearly from the beam shaped portion to the second and third portion.

Preferably, the sensor device does not contain a flux concentrator (also known as integrated magnetic concentrator).

Preferably, the busbar is not integrated inside the sensor device.

In an embodiment, the second distance (e.g. Zs) is smaller than 4.0 mm and is smaller than a value Zmax1 defined by the following formula: $Zmax1=0.5+(Lc/2)$, wherein Lc is the length of the beam shaped portion, and wherein Zs, Zmax1 and Lc are expressed in millimeters.

For example, in this embodiment, the reference point R of the sensor device is located at a distance of at most 4.0 mm from the busbar, or below the dotted horizontal lines 1901 to 1906 of FIG. 19.

In an embodiment, the first distance (e.g. Xs) is smaller than 3.0 mm and is smaller than a value Xmax1 defined by the following formula: $Xmax1=(Zs-0.5)/M$; wherein Zs is the second distance of at least 0.5 mm, and Lc is the length of the beam shaped portion, and M is expressed by the following formula: $M=0.40+(Lc/30)$; and wherein Xs, Zs, Lc and Xmax1 are expressed in millimeters.

For example, in this embodiment, the reference point R is located above and on the left of the inclined lines 1910 to 1915 of FIG. 19.

In an embodiment, the first distance (e.g. Xs) is equal to 0 mm. Or stated in other words, in this embodiment, the reference point R of the sensor device is located above a center-line or heart-line of the beam shaped portion, or in a symmetry plane of the beam shaped portion.

In an embodiment, the second distance (e.g. Zs) is at least 1.0 mm; and wherein the second distance (e.g. Zs) is a value smaller than Lc/2; wherein Lc is the length of the beam shaped portion; and wherein the value of Xs, Zs, and Lc are expressed in millimeter.

In this embodiment, the reference point R of the sensor device is located above the center of the beam shaped portion (in the X-direction), and at a certain height Zs very similar to the range shown in FIG. 20, where the attenuation is within ±1% and the phase shift is within ±1°.

In an embodiment, the second distance (e.g. Zs) is a value in the range from (Zza−1.0 mm) to (Zza+1 mm), wherein Zza is expressed by the following formula: $Zza=(0.5)+(0.3)*Lc$, wherein Lc is the length of the beam shaped portion, and wherein Zza and Lc are expressed in mm.

In this embodiment, the reference point R of the sensor device is located at a location where the attenuation is close to 0%, as can be appreciated from FIG. 21. A few examples are: Zza=1.7 mm if Lc=4 mm; Zza=2.0 mm if Lc=5 mm; Zza=2.3 mm if Lc=6 mm; Zza=2.6 mm if Lc=7 mm; Zza=2.9 mm if Lc=8 mm; Zza=3.5 mm if Lc=10 mm.

In an embodiment, the second distance (e.g. Zs) is a value in the range from (Zza−0.5 mm) to (Zza+0.5 mm).

In an embodiment, the beam shaped portion has a thickness (e.g. T) in the range from 2.0 to 3.0 mm.

In an embodiment, the cross sectional area of the beam shaped portion is at least 6 mm$^2$, or at least 8 mm$^2$, or is at least 10 mm$^2$. The larger this area, the lower the heat dissipation.

In an embodiment, the beam shaped portion of the busbar has a width (e.g. Wp) in the range from 2.2 to 3.8 mm, or from 2.4 to 3.6 mm, or from 2.5 to 3.5 mm, or from 2.7 mm to 3.3 mm, or from 2.8 mm to 3.2 mm.

In an embodiment, the two sensor elements are two horizontal Hall elements.

These sensor elements are preferably integrated in a semiconductor substrate. The semiconductor substrate is preferably oriented parallel to a surface of the busbar, perpendicular to the rectangular cross-section of the busbar. The two sensor elements are preferably spaced apart in the width direction of the busbar.

In an embodiment, the two sensor elements are spaced apart by a distance (e.g. dx) in the range from 1.25 mm to 2.75 mm, or in the range from 1.5 mm to 2.5 mm, or in the range from 1.6 mm to 2.4 mm, or in the range from 1.7 mm to 2.3 mm, or in the range from 1.8 mm to 2.2 mm.

In an embodiment, the sensor device comprises a semiconductor substrate; and the semiconductor substrate has an active surface comprising said two magnetic sensor elements; and the semiconductor substrate is oriented such that its active surface is facing away from the busbar; and the sensor device is mounted on a printed circuit board, such that the printed circuit board is situated between the beam shaped portion and the sensor device.

In an embodiment, the beam shaped portion of the busbar is situated between a second portion and a third portion of the busbar, the second portion having a second width (e.g. Wbb), the third portion having a width equal to the second width; and wherein a ratio (e.g. Wbb/Wp) of the second width (e.g. Wbb) and the width (e.g. Wp) of the beam shaped portion is at least 120%, or at least 140%, or at least 160%, or at least 180%, or at least 200%.

In an embodiment, a ratio (e.g. Lc/dx) of the length (e.g. Lc) of the beam shaped portion and the distance (e.g. dx) between the two sensor elements is at least 200%.

In an embodiment, a ratio (e.g. T/Wp) of the thickness (e.g. T) and the width (e.g. Wp) of the beam shaped portion is at most 100%.

In an embodiment, a ratio (e.g. Wp/dx) of the width (e.g. Wp) of the beam shaped portion and the distance (e.g. dx) between the two sensor elements is at least 50%.

In an embodiment, a ratio (e.g. Wp/dx) of the width (e.g. Wp) of the beam shaped portion and the distance (e.g. dx) between the two sensor elements is at most 200%.

In an embodiment, a ratio (e.g. Zs/dx) of the second distance (e.g. Zs) and the distance (e.g. dx) between the two sensor elements is at least 50%.

In an embodiment, a ratio (e.g. Zs/dx) of the second distance (e.g. Zs) and the distance (e.g. dx) between the two sensor elements is at most 200%;

In an embodiment, a ratio (e.g. Xs/dx) of the first distance (e.g. Xs) and the distance (e.g. dx) between the two sensor elements is at most 200%, or at most 100%, or at most 50%.

In an embodiment, the distance (e.g. dx) between the two horizontal Hall elements is smaller than the width (e.g. Wp) of the beam shaped portion, e.g. at least 0.2 mm smaller, or at least 0.4 mm smaller, or at least 0.6 mm smaller, or at least 0.8 mm smaller, or at least 1.0 mm smaller.

In an embodiment, the lateral position (e.g. Xs) of the sensor device is chosen such that a vertical projection of the two sensor elements in a direction perpendicular to the upper surface of the busbar, intersects said upper surface twice. Or stated in other words, in this embodiment, each of the two sensor elements is located "above" the beam shaped portion of the busbar.

In an embodiment, the lateral position (e.g. Xs) of the sensor device is chosen such that a vertical projection of the two sensor elements in a direction perpendicular to the upper surface of the busbar, intersects said upper surface only once. Or stated in other words, in this embodiment, one sensor element is located "above" the busbar, and the other sensor element is located "next to the busbar".

In an embodiment, the thickness (e.g. T) of the beam shaped portion is smaller than or equal to the width (e.g. Wp) of the beam shaped portion, or expressed mathematically: T≤Wp.

In an embodiment, the width (e.g. Wp) of the beam shaped portion is at least 50% of the distance (e.g. dx) between the sensor elements, or expressed mathematically: Wp≥dx*(0.5); or Wp≥dx*(0.6); or Wp≥dx*(0.7); or Wp≥dx*(0.8).

In an embodiment, the width (e.g. Wp) of the beam shaped portion is at most 200% of the distance (e.g. dx) between the sensor elements, or expressed mathematically: Wp≤dx*(2.0); or Wp≤dx*(1.8); or Wp≤dx*(1.6); or Wp≤dx*(1.4); or Wp≤dx*(1.2).

In an embodiment, the length (e.g. Lc) of the beam shaped portion is at least 200% of the distance (e.g. dx) between the sensor elements, or expressed mathematically: Lc≥dx*(2.0); or Lc≥dx*(2.25); or Lc≥dx*(2.5); or Lc≥dx*(2.75); or Lc≥dx*(3.0).

In an embodiment, the length (e.g. Lc) of the beam shaped portion is a value in the range from 4.0 mm to 10.0 mm, or in the range from 4.0 mm to 8.0 mm, or in the range from 4.0 mm to 6.0 mm.

In an embodiment, the reference point (e.g. R) of the sensor device is located at a height position (e.g. Zs) above the beam shaped portion of at least 50% of the distance (e.g. dx) between the sensor elements, or expressed mathematically: Zs≥dx/2; or Zs≥dx*(0.6); or Zs≥dx*(0.7); or Zs≥dx*(0.8); or Zs≥dx*(0.9); or Zs≥dx. If the distance is sufficiently large, no flip-chip arrangement is required.

In an embodiment, the lateral position (e.g. Xs) of the reference point (e.g. R) is at most 200% of the distance (e.g. dx) between the sensor elements, or expressed mathematically: Xs≤dx*(2.0); or Xs≤dx*(1.5); or Xs≤dx; or Xs≤dx*(0.5); or Xs≤dx*(0.25).

In an embodiment, the overall width (e.g. Wbb) of the busbar (e.g. the width the busbar would have if it does not have lateral cut-outs, or the width of the second and third busbar portion), is at least 120% of the width (e.g. Wp) of the beam shaped portion, or expressed mathematically: Wbb≥Wp*(1.2); or Wbb≥Wp*(1.4); or Wbb≥Wp*(1.6); or Wbb≥Wp*(1.8); or Wbb≥Wp*2.

In an embodiment, the current sensor system can be described by a set of parameters that satisfies all of the following conditions: T≤Wp; and Wp≥dx; and Wp≤dx*2; and Lc≥2*dx; and Zs≥dx/2; and Xs≤dx; and Wbb≥Wp*(1.2); and preferably also Lc≥Wp.

In an embodiment, the beam shaped portion is situated between a second busbar portion and a third busbar portion, each of the second and third busbar portion having a width (e.g. Wbb) of at least 200% of the width (e.g. Wp) of the beam shaped portion.

According to a second aspect, the present invention also provides a current sensor system for measuring an AC electrical current, comprising: a busbar comprising a beam shaped portion having a predefined length (e.g. Lc) extending in a first direction (e.g. Y), and a predefined thickness (e.g. T) in a second direction (e.g. Z), and a predefined width (e.g. Wp) in a third direction (e.g. X) perpendicular to the first direction (e.g. Y); a sensor device comprising two sensor elements (e.g. H1, H2) spaced apart by a predefined distance (e.g. dx) along the third direction (e.g. X), each sensor element being configured for measuring a magnetic field component (e.g. Bz1, Bz2) oriented in the second direction (e.g. Z); the sensor device being configured for determining a difference (e.g. ΔBz) between these magnetic field components (e.g. Bz1, Bz2), and for determining said AC current based on said difference (e.g. proportional thereto); wherein the sensor device is positioned relative to the busbar such that a reference point (e.g. R) of the sensor device situated in the middle between the two sensor elements (e.g. H1, H2) is located at a first distance (e.g. Xs) measured in the third direction (e.g. X) from a symmetry plane (e.g. Ω) of the beam shaped portion, and is located at a second distance (e.g. Zs) from the busbar measured in the second direction (e.g. Z); and wherein the width (e.g. Wp) of the beam shaped portion is 50% to 200% of the distance (e.g. dx) between the sensor elements; and wherein the length (e.g. Lc) of the beam shaped portion is at least 200% of the distance (e.g. dx) between the sensor elements; and wherein the second distance (e.g. Zs) is at least 50% of the distance (e.g. dx) between the sensor elements; and wherein the first distance (e.g. Xs) is at most 200% of the distance (e.g. dx) between the sensor elements.

In an embodiment, the beam shaped portion is situated between a second busbar portion and a third busbar portion, each of the second and third busbar portion having a width (e.g. Wbb) of at least 200% of the width (e.g. Wp) of the beam shaped portion.

According to a third aspect, the present invention also provides a current sensor system for measuring an AC electrical current, comprising: a busbar comprising a beam shaped portion having a predefined length (e.g. Lc) extending in a first direction (e.g. Y), and a predefined thickness (e.g. T) in a second direction (e.g. Z), and a predefined width (e.g. Wp) in a third direction (e.g. X) perpendicular to the first direction (e.g. Y); a sensor device comprising two sensor elements (e.g. H1, H2) spaced apart by a predefined distance (e.g. dx) along the third direction (e.g. X), each sensor element being configured for measuring a magnetic field component (e.g. Bz1, Bz2) oriented in the second direction (e.g. Z); the sensor device being configured for determining a difference (e.g. ΔBz) between these magnetic field components (e.g. Bz1, Bz2), and for determining said AC current based on said difference (e.g. proportional thereto); wherein the sensor device is positioned relative to the busbar such that a reference point (e.g. R) of the sensor device situated in the middle between the two sensor elements (e.g. H1, H2) is located at a first distance (e.g. Xs) measured in the third direction (e.g. X) from a symmetry plane (e.g. Ω) of the beam shaped portion, and is located at a second distance (e.g. Zs) from the busbar measured in the second direction (e.g. Z); and wherein a ratio (e.g. T/Wp) of the thickness (e.g. T) and the width (e.g. Wp) of the beam shaped portion is at most 100% or at most 90%; and wherein a ratio (e.g. Wp/dx) of the width (e.g. Wp) of the beam shaped portion and the distance (e.g. dx) between the sensor elements is a value in the range from 50% to 200%, or a value in the range from 60% to 180%; and wherein a ratio (e.g. Lc/Wp) of the length (e.g. Lc) and the width (e.g. Wp) of the beam shaped portion is at least 100% or at least 110% or at least 125% or at least 150% or at least 200%; and wherein a ratio (e.g. Zs/dx) of the second distance (e.g. Zs) and the distance (e.g. dx) between the sensor elements is a value in the range from 50% to 200%; and wherein a ratio (e.g. Xs/dx) of the first distance (e.g. Xs) and the distance (e.g. dx) between the sensor elements is at most 200% or at most 150% or at most 100% or at most 50%.

In an embodiment, the beam shaped portion is situated between a second busbar portion and a third busbar portion, each of the second and third busbar portion having a width (e.g. Wbb) of at least 200% of the width (e.g. Wp) of the beam shaped portion.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 2(a) shows a plot of the amplitude of a magnetic field gradient dBz/dx measured at various locations in a transverse direction of a busbar and for various frequencies.

FIG. 2(b) shows a plot of the attenuation of the magnetic field gradient dBz/dx for a sinusoidal current signal of frequency f, relative to the magnetic field gradient dBz/dx for a DC-signal measured at the same location, for various locations in a transverse direction of the busbar, and for various frequencies.

FIG. 4(a) shows curves for a busbar having a width of 5 mm.

FIG. 4(b) to FIG. 4(e) show curves for a busbar having a width of 6, 7, 8 and 10 mm respectively.

FIG. 5 shows a table corresponding to the graphs of FIG. 4(a) to FIG. 4(e), showing the ideal lateral position of the sensor device for achieving 0% attenuation, and the ideal lateral position for achieving 0° phase shift, of the magnetic field gradient dBz/dx, for a distance of 3, 4 or 5 mm from the busbar. As can be seen, these ideal positions are not identical, but surprisingly very close to each other.

Figure 1A:
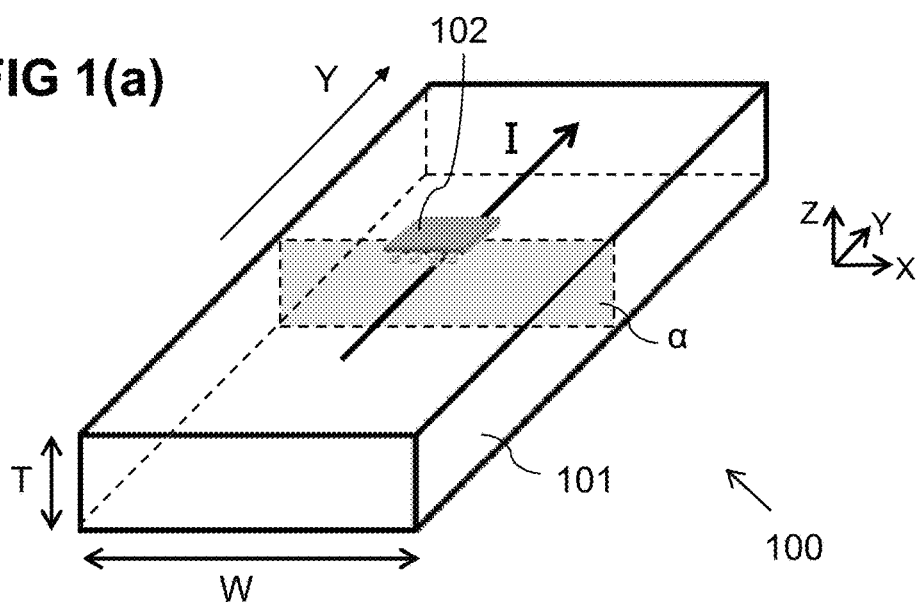
FIG. 1(a) shows a perspective view.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "current sensor system" or "current sensor arrangement" mean the same. They refer to a system or arrangement comprising a busbar for conducting an electrical current and a current sensor device for measuring that current.

It is known that complex numbers can be represented by a magnitude (or amplitude) and a phase, or by a real part and an imaginary part. For example, the complex number "1+i" can also be represented by a vector having an amplitude (or magnitude) of $\sqrt{2}$ and a phase of 45°.

In this document, the term "magnetic field gradient" dBz/dx refers to a spatial gradient of the magnetic field component Bz along the X-direction. In practice, the division by dx is often omitted.

In this document, the term "magnetic field difference" ΔBz is used to indicate a difference between two magnetic field components.

In this document, the terms "magnetic field gradient" and "magnetic field difference" can be used interchangeable, unless explicitly mentioned otherwise or clear from the context otherwise.

The present invention relates to current sensors based on magnetic sensors, also referred to as "magnetic current sensors", as may be used in industrial or automotive applications, e.g. for measuring one or more currents provided to an electrical motor, e.g. in electrical or hybrid vehicles. Such electrical motors may be driven using relatively large AC currents, for example substantially sinusoidal currents having amplitudes of tens or even hundreds of amperes. The present invention is particularly concerned with accurately measuring such AC currents.

As already mentioned in the background section, it is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

The inventors of the present invention had the task of providing a sensor system capable of measuring an AC current flowing through a busbar such as the one shown in FIG. 1(a), with improved AC accuracy. The AC current may for example be a sinusoidal current having any frequency from e.g. 100 Hz to e.g. 2000 Hz.

The inventors decided to use a gradiometric sensor device, i.e. a sensor device capable of measuring a magnetic field gradient, because this offers the advantage that the sensor is highly insensitive to an external disturbance field, despite the disadvantage that a gradient signal is typically an order of magnitude weaker than the magnetic component signals from which the gradient is derived.

Figure 1B:
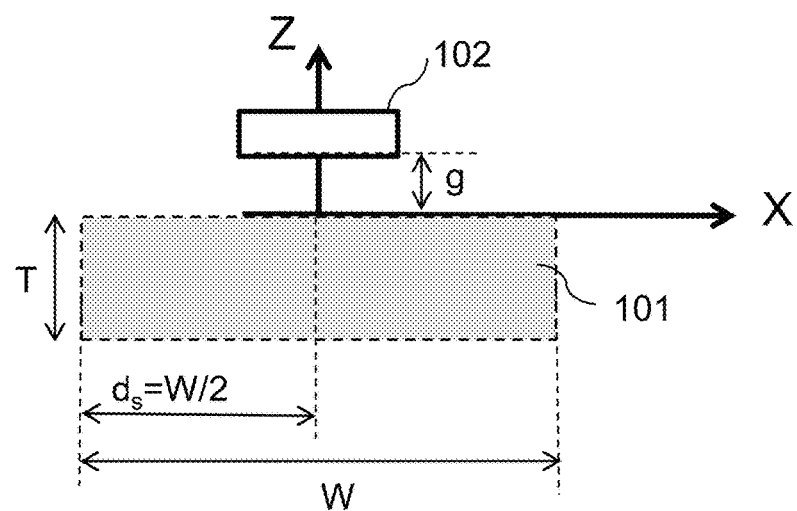
FIG. 1(b) shows a cross sectional view of a current sensor arrangement, where a current sensor device is mounted above, substantially in the middle of a busbar.

FIG. 1(a) shows a perspective view, and FIG. 1(b) shows a cross sectional view of a current sensor 100, comprising a busbar 101 extending in a longitudinal direction (the Y-direction). The busbar 101 has a thickness T in the Z-direction, and a width W in the X-direction. The busbar 101 has a rectangular cross section in a transversal plane α parallel to the X-Z plane. The current I to be measured flows in the Y-direction, substantially perpendicular to the transversal plane α.

Figure 1C:
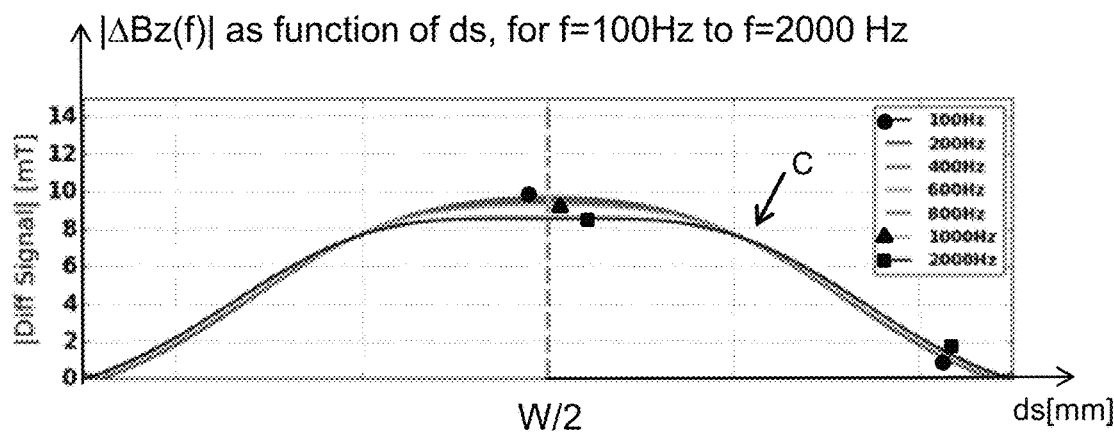
FIG. 1(c) shows the magnitude of a magnetic field gradient dBz/dx measured by the sensor device of FIG. 1(a) for various locations of the sensor device along the X-axis, and for various frequencies. As can be seen, the center position provides the largest signal.

FIG. 1(c) shows curves of the magnitude $|\Delta Bz|$ of a difference between two magnetic field components Bz1, Bz2 oriented in the Z-direction, measured at two locations spaced apart in the X-direction, of a magnetic field created by a sinusoidal current, when the sensor device 102 is located at a certain distance "g" (also referred to as "airgap"), as a function of the transverse position x.

These curves can be obtained for example by performing simulations. Simulations were performed for a sinusoidal current having a frequency of 100 Hz, 200 Hz, 400 Hz, 600 Hz, 800 Hz, 1000 Hz and 2000 Hz, using a busbar having a width of 6 mm and a thickness of 3 mm, and assuming the sensor elements are spaced apart by 2.2 mm.

As can be seen, the largest amplitude of $|\Delta Bz|$ is obtained when the sensor device 102 is positioned in the middle of the busbar 101. This is the position where the "largest signal" can be measured, thus providing the best signal-to-noise ratio (SNR), but in this position the measurement is very much dependent on the frequency of the AC current, which is undesirable.

The inventors went a step further and noticed that the curves for relatively low frequencies substantially coincide (this is the case for the curves of 100 Hz to 600 Hz), but as the frequency increases, the curves start to deviate, especially near the centre of the busbar. Indeed, the maximum of the 800 Hz, 1000 Hz and 2000 Hz curve is only about 97%, 95%, and 88% of the maximum of the 100 Hz curve, respectively. Or stated in other words, the gradient signal of 800 Hz, 1000 Hz and 2000 Hz is attenuated by 3%, 5% and 12% respectively, because of the skin effect.

This means that, if the current would be perfectly sinusoidal, and if the frequency of the current would be known, the sensor device could compensate for this attenuation and provide an accurate measurement, but the problem is that, in general, the AC currents provided to a motor have varying frequencies and/or are not perfectly sinusoidal, meaning that, in general, the current waveform has many frequencies. It therefore seemed impossible to accurately measure the current without determining the frequency content. In some applications, it is also desirable to be able to accurately detects system faults, such as current spikes or over-currents, which may occur at higher frequencies than the fundamental frequency provided to the load.

The inventors went another step further, and surprisingly noticed that the curves change position as the sensor device is mounted closer to the edge of the busbar. Indeed, as can be seen in FIG. 1(c), the 2000 Hz curve (indicated with a black square) provides a larger gradient signal than the 100 Hz curve (indicated by a black circle, which is located lower than the curve with the square), contrary to the position of the curves near the center. This position change seems to occur near the point indicated with letter "C". The inventors decided to investigate this in more detail in FIG. 2(a) to FIG. 2(c).

Figure 2C:
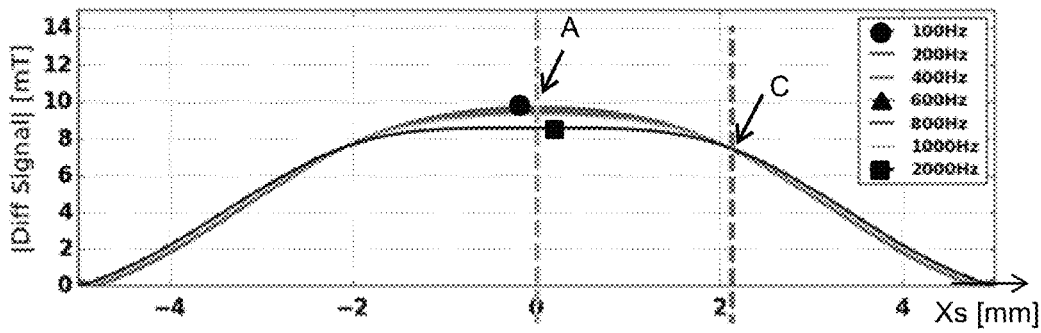
FIG. 2(c) shows a plot of the phase shift of the magnetic field gradient dBz/dx for a sinusoidal current signal of frequency f, relative to the magnetic field gradient dBz/dx for a DC-signal measured at the same location, for various locations in a transverse direction of the busbar, and for various frequencies.
Figure 2C:
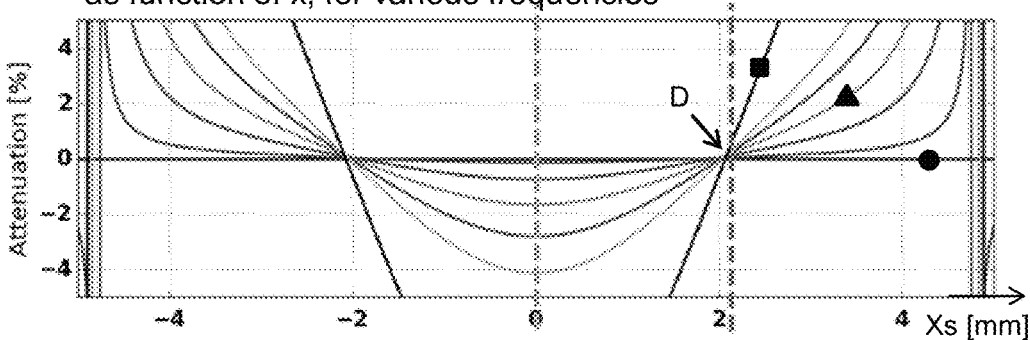
Figure 2C:
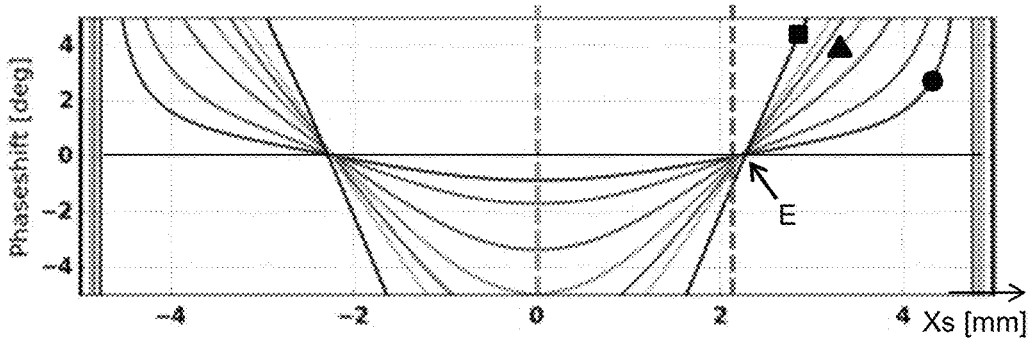
Figure 3A:
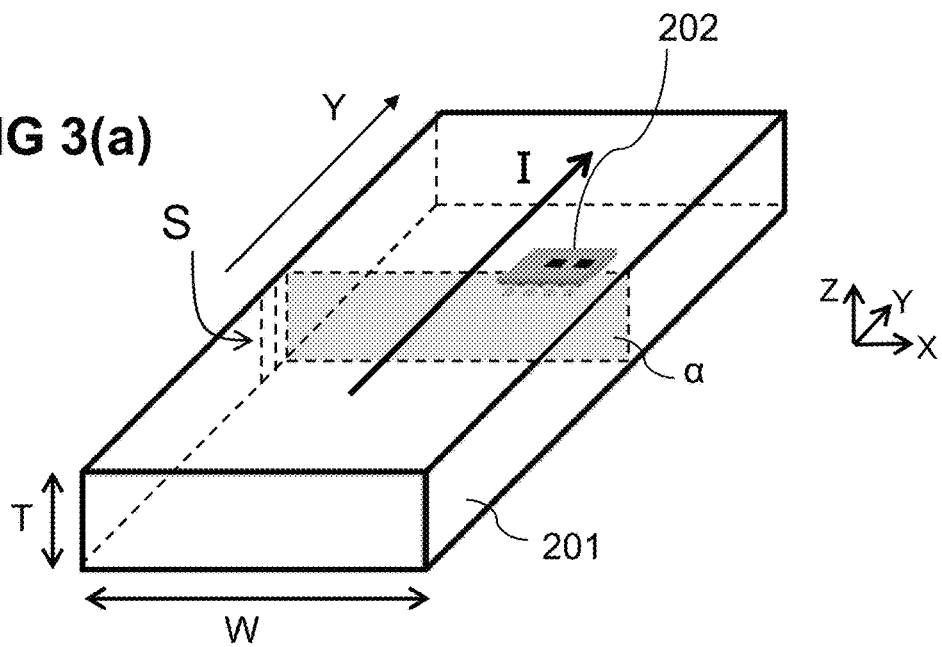
FIG. 3(a) shows a current sensor system proposed by the present invention.
Figure 3B:
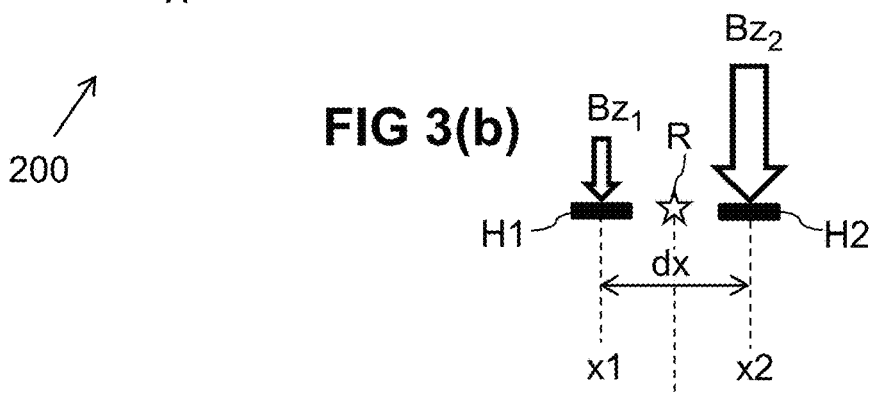
FIG. 3(b) is a schematic representation of two sensor elements spaced apart from each other, defining an (imaginary) reference point in the middle between them.

FIG. 2(a) is a replica of FIG. 1(c), showing a plot of the amplitude of the magnetic field gradient dBz/dx, or actually the amplitude of the signal $\Delta Bz$, or $|Bz|=|Bz1-Bz2|$, Bz1 being the value of a first magnetic field component Bz1 measured at a first sensor location x1, and Bz2 being the value of the second magnetic field component measured at the second sensor location x2, spaced apart from x1 by a distance dx along the X-direction (see FIG. 3(b)). Curves are shown for a number of frequencies.

Rather than staring at the amplitude signal of FIG. 2(a), and wondering how to cope with the different attenuations for different frequencies (the 97%, the 95% and the 88% mentioned above), the inventors took a radically different approach, and came to the idea of simulating and visualising the attenuation (or attenuation variations relative to the gradient of a 100 Hz signal) and phase shift of the signal $\Delta Bz(f)$ as a function of the position of the sensor device along the X-axis, for various frequencies, resulting in FIG. 2(b) and FIG. 2(c) respectfully.

FIG. 2(b) shows a graph with attenuation curves, and FIG. 2(c) shows a graph with phase shift curves of the differential signal $\Delta Bz(f)$ as a function of the position along the X-axis, for several frequencies ranging from 100 Hz to 2000 Hz.

Very surprisingly, and totally unexpectedly, they discovered that the relative attenuation curves of 100 Hz, 200 Hz, 400 Hz, 600 Hz, 800 Hz, 1000 Hz and 2000 Hz all seem to pass through a single (virtual) point "D", and they discovered that the phase shift curves of 100 Hz, 200 Hz, 400 Hz, 600 Hz, 800 Hz, 1000 Hz and 2000 Hz all seem to pass through a single (virtual) point "E", and they noticed that, even though the points "D" and "E" do not exactly coincide, they are located very close together.

The inventors wondered what would happen if the sensor device would be placed at a position along the X-axis, in close vicinity to the point "D" and "E", for example at point "D", or at point "E", or between point "D" or "E", e.g. in the middle between point "D" and "E". And they also wondered where the points "D" and "E" are located in practice, on which parameters they depend, and how they can be determined.

Figure 3C:
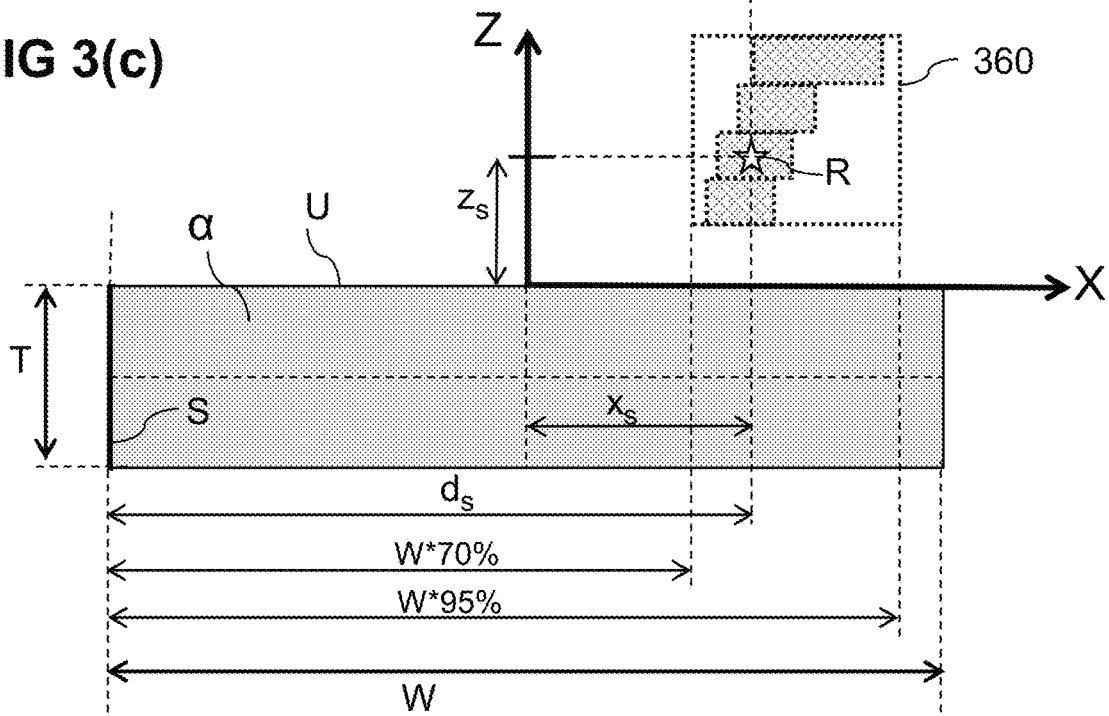
FIG. 3(c) is a schematic representation showing preferred positions of the sensor device relative to the busbar, as proposed by the present invention.

With this in mind, they performed another set of simulations, the results of which are depicted in FIGS. 4(a) to 4(e) and FIG. 5, but before describing them, the parameters involved are explained in FIG. 3(a) to FIG. 3(c).

FIG. 3(a) shows a current sensor system 200 proposed by the present invention. The current sensor system 200 comprises a busbar 201 and a current sensor device 202 mounted relative to the busbar. The busbar 201 may for example be a metallic bar having an elongated shape extending in the Y-direction and having a rectangular cross section in a plane substantially perpendicular to the direction of the current when flowing through the busbar. This cross-section has a thickness T and a width W.

In all embodiments of the present invention, it is assumed that the width W is equal to or larger than the thickness T ($W \geq T$). The busbar can for example be made of copper or aluminium, or a copper alloy or an aluminium alloy, but the present invention is not limited thereto, and other electrically conductive materials can also be used.

The current sensor device 202 is an integrated semiconductor device comprising a substrate (not explicitly shown), comprising at least two magnetic sensor elements H1, H2, for example two horizontal Hall elements, spaced apart over a distance dx. This distance is preferably a value in the range from about 1.0 mm to 2.5 mm, or from 1.5 mm to 2.5 mm, e.g. equal to about 1.8 mm, or equal to about 2.0 mm, or equal to about 2.2 mm, but the present invention is not limited thereto and other distances in the range from 0.5 mm to 4.0 mm are also contemplated.

FIG. 3(b) is a schematic representation of a current sensor as can be used in embodiments of the present invention, containing two horizontal Hall elements H1, H2. The sensor device 201 is preferably oriented such that the semiconductor substrate is substantially parallel to the upper surface of the busbar, i.e. parallel to the X-Y plane of FIG. 3(a), or stated in other words: parallel to the longitudinal direction Y, and parallel to the transverse direction X (also referred to as the "width direction"). The first horizontal Hall element H1 is located at a first sensor position x1. The second horizontal Hall element H2 is located at the second sensor position x2, at a distance dx from the first sensor location along the X-axis, i.e. in a transverse direction of the busbar. For the sake of the description, an (imaginary) reference point "R" is defined in the middle between the first and second sensor element, thus at position x=(x1+x2)/2 along the X-axis. This reference point "R" allows the position of the sensor device 202 to be defined by two parameters: a first distance "Zs" (measured in the Z-direction) between the reference point "R" and the busbar 201, and a second distance "ds" (measured in the X-direction), between the reference point "R" and a side "S" of the busbar 201, as illustrated in FIG. 3(c).

FIG. 3(c) is a schematic representation showing preferred positions of the reference point "R", and thus of the sensor device 202 relative to the busbar 201, as proposed by the present invention.

As proposed herein, the sensor device 202 is to be positioned relative to the busbar 201 such that the reference point R is to be located in the rectangular area 360, referred to herein as the "sweet zone". In its broadest form, this zone can be specified as the zone where the first distance "Zs" between the reference point R of the sensor device and the busbar, measured in the Z-direction, is a value in the range from 0.5 mm to 4.0 mm; and where the second distance "ds" between the reference point R and the side "S" of the busbar, measured in the X-direction, is a value in the range from 70% to 110% of the width "W", or in the range from 70% to 95% of the width "W" of the busbar. Of course, other parameters can be used to define the same location. For example, instead of specifying the distance "ds" between the reference point R and the side surface S of the busbar (measured in the X-direction), one could also specify the parameter "Xs" being the distance between the reference point R and the middle of the busbar, measured in the X-direction. The parameter Xs can be converted into the parameter ds, using the formula: ds=(W/2)+Xs. As an example, the location Xs=20% of the half width (W/2) corresponds to ds=50%+10%=60% from the side of the busbar. Other examples will be given further.

It was surprisingly found that, if the sensor device 201 is positioned with its reference point R inside this "sweet zone", the sensor system has a better AC response as compared to that of the system of FIGS. 1(a) to 1(c) where the sensor device is located in the middle of the busbar, despite the amplitude of the signal ΔBz(at 100 Hz) of point C of FIG. 2(a) being only about 76% of the amplitude of the signal ΔBz(at 100 Hz) measured in point A of FIG. 2(a). This means that the signal to noise ratio (SNR) may be slightly worse in the vicinity of point C (as compared to point "A"), but the advantages in terms of frequency response may be more important in some applications.

More specifically, if the sensor device is located in the "sweet zone", the relation between the gradient signal ΔBz and the amplitude of the AC current is substantially constant, irrespective of the frequency of the AC current, at least for frequencies in the range from about 100 Hz to about 2000 Hz. This means, for example, that the measurement of a pure sinusoidal AC current having a single frequency chosen in the range from 100 Hz to 2000 Hz will typically have at least the same accuracy as the system 100 of FIGS. 1(a) to 1(c), provided that the system of FIGS. 1(a) to 1(c) would use the correct attenuation factor for that particular frequency, but the system of FIGS. 2(a) to 2(c) does not need to know the frequency, nor does it need to apply different attenuation factors for different frequencies.

But probably more importantly, the discovery underlying the present invention, and the solution proposed by the present invention based on that discovery, also means that an AC current having a waveform with many harmonics, for example a block wave (also known as "square wave"), or a triangular wave, or even non-periodic waveforms having multiple harmonics, will be measured with an improved accuracy. The reader not familiar with the terms "harmonics" and "Fourier analysis" can refer for example to https://en.wikipedia.org/wiki/Square_wave, for more information.

Besides the improved accuracy, the measurement of the present invention moreover requires only minimal processing power (no Discrete Fourier Transform DFT, no Fast Fourier Transform FFT, or spectral analysis, no powerful processor or RAM are required) and only minimal delay (typically a single sample period), allowing the current to be sampled at very high frequency. Indeed, the momentary amplitude of the AC current can be determined almost instantly, by measuring the magnetic field components Bz1 and Bz2, by calculating a difference (or gradient) of these signals, and by multiplying this difference with a predefined constant factor K, which is independent of the frequency (or frequencies) of the current.

As will be explained further, the boundaries of the "sweet zone" depend on the required precision, and the area of the sweet zone will decrease as the required precision increases.

Figure 4A:
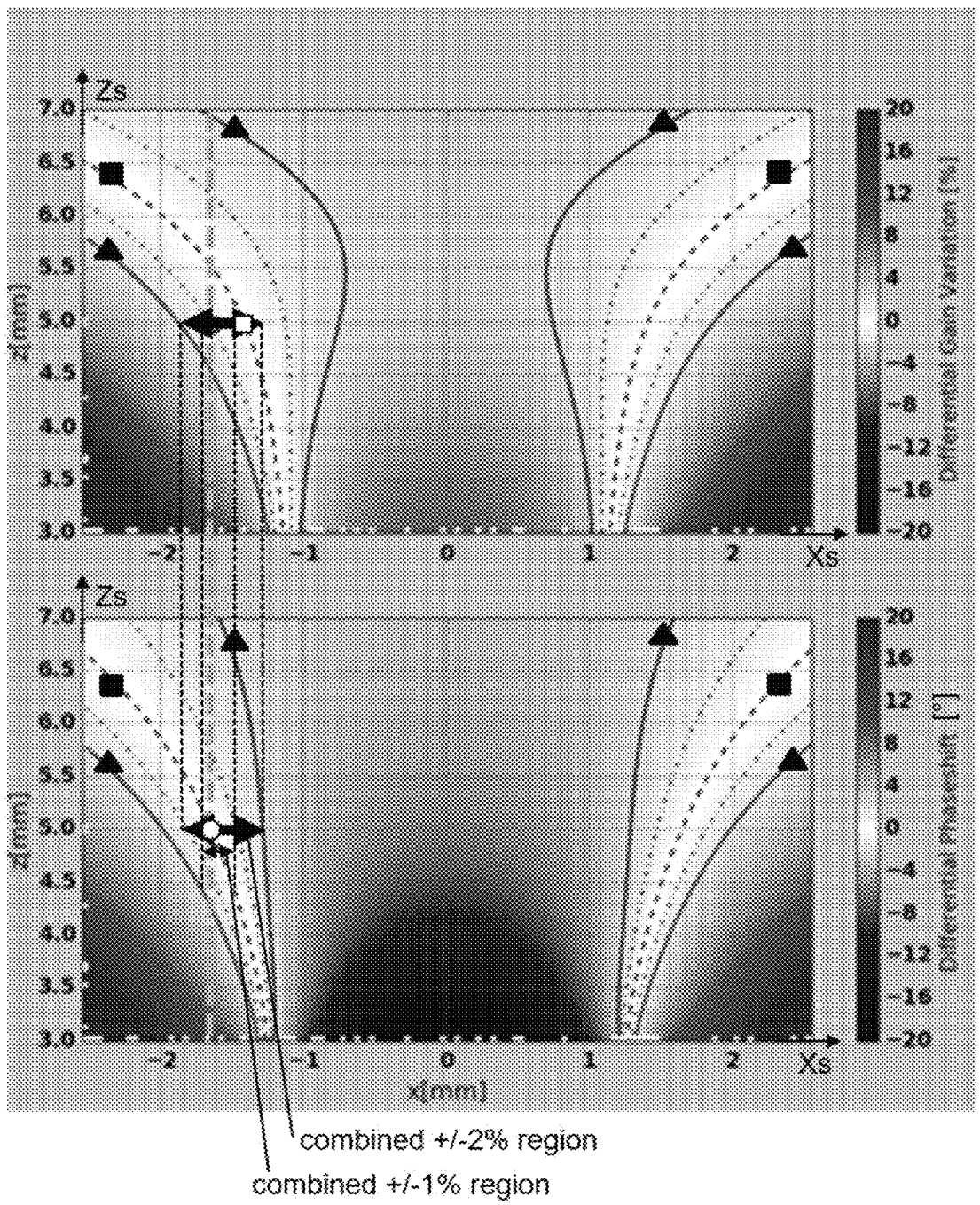
FIG. 4(a) to FIG. 4(e) each show an upper graph and a lower graph. The upper graph shows attenuation variations (in %), and the lower graph shows phase shift variations (in °) of the magnetic field gradient dBz/dx for various positions of the sensor device relative to the busbar.

FIG. 4(a) shows simulation results for a sensor system as shown in FIG. 3(c), having a busbar with a rectangular cross section, conducting a sinusoidal current having a frequency of 2000 Hz. The upper graph shows the attenuation deviation (in %), and the lower graph shows the phase shift (in degrees), for various positions as defined by the parameters Zs and Xs.

As can be seen in the legend, the dashed curve (indicated by a black square) of the upper graph shows positions where the attenuation variation is 0%, i.e. where the amplitude of the signal ΔBz (at 2000 Hz) is equal to the amplitude ΔBz (at 100 Hz) measured at the same location. The full curves (indicated by a black triangle) show locations where the attenuation deviation is +2% or −2%, meaning locations where the amplitude of the signal ΔBz (at 2000 Hz) deviates by +2% or −2% relative to the amplitude of the signal ΔBz (at 100 Hz) measured at the same location. The (white colored) area between the curves with the triangles are positions where the attenuation variation is smaller than 2% in absolute value.

Likewise, the dashed curve (with the black square) of the lower graph shows locations where the phase of the signal ΔBz (at 2000 Hz) is 0°; and the full curves (with the triangles) show locations where the phase of the signal ΔBz (at 2000 Hz) deviates by +2° or −2° measured at the same location.

If, for example, the sensor device is chosen to be located at a distance Z=5.0 mm from the busbar, the ideal X-position where the attenuation deviation=0% is situated at the location indicated by the white square (on top of the black arrow), which is located approximately at ds=78% from the right side of the busbar. The ideal X-position where the phase shift=0° is situated at the location indicated by a white circle (on top of the black arrow), which is located approximately at ds=81% from the right side of the busbar. These ideal X-positions are not exactly the same, but they only differ by 3%, thus they are very close to each other.

In practice, of course, the sensor device can only be located in one position.

As an example, if the reference point R of the sensor device is situated at the position of the white circle, the phase shift is 0°, and the attenuation deviation is approximately equal to +1%.

As another example, if the reference point R of the sensor device is situated at the position of the white square, the attenuation deviation is 0%, and the phase shift is approximately equal to −1°. These are both very suitable positions for positioning the sensor device.

But of course, the present invention is not limited to sensor systems where the attenuation deviation is at most ±1% and the phase shift is at most ±1°, but the invention also works for slightly larger tolerance margins, for example ±2% and ±2°, or ±3% and ±3°, or ±4% and ±4°.

Referring back to FIG. 4(a), the X-positions (at Z=5.0 mm) where both the phase shift is less than a given tolerance margin (e.g. ±2°) and the attenuation deviation is less than a given tolerance margin (e.g. ±2%), referred to herein as the "combined ±2% and ±2° region" is indicated by a black arrow, and is located at ds-values from about 76% to about 86% of the width W of the busbar, i.e. at locations where ds is a value from about 3.80 mm to about 4.30 mm from the side of the busbar.

For comparison, also the "combined ±1% and ±1° region" (at Z=5.0 mm) is indicated by a small black arrow. This corresponds to ds-values ranging from about 79% to about 84% of the Width of the busbar, i.e. for ds-values in the range from about 3.95 mm to about 4.20 mm from the side of the busbar.

But of course, the present invention is not limited to sensor systems where the first distance Z is 5.0 mm, and the sensor device can also be located at other distances from the busbar, e.g. at a distance Zs in the range from about 0.1 mm to about 5.0 mm, or in the range from about 0.5 mm to about 4.5 mm, or at a distance Zs in the range from about 1.0 mm to about 4.0 mm. For each chosen Z-value, a range of X-values (or ds-values) where the attenuation is substantially constant within a first tolerance margin (e.g. ±4%) and/or the phase is substantially constant within a second tolerance margin (e.g. ±4°) can be found by means of these simulation curves.

FIG. 4(b) to FIG. 4(e) show similar graphs as FIG. 4(a) for a busbar having a width of W=6 mm, W=7 mm, W=8 mm and W=10 mm respectively. The same principles apply, but of course, the curves are different, and thus the locations are slightly different. As can be seen, the (white color) regions where the attenuation deviation is close to 0% and the (white color) regions where the phase shift is close to 0° have a "banana shape", which is quite narrow close to the busbar (small Z-value), and typically bending outwards and widening for increasing Z (i.e. larger distance from the busbar).

Figure 4C:
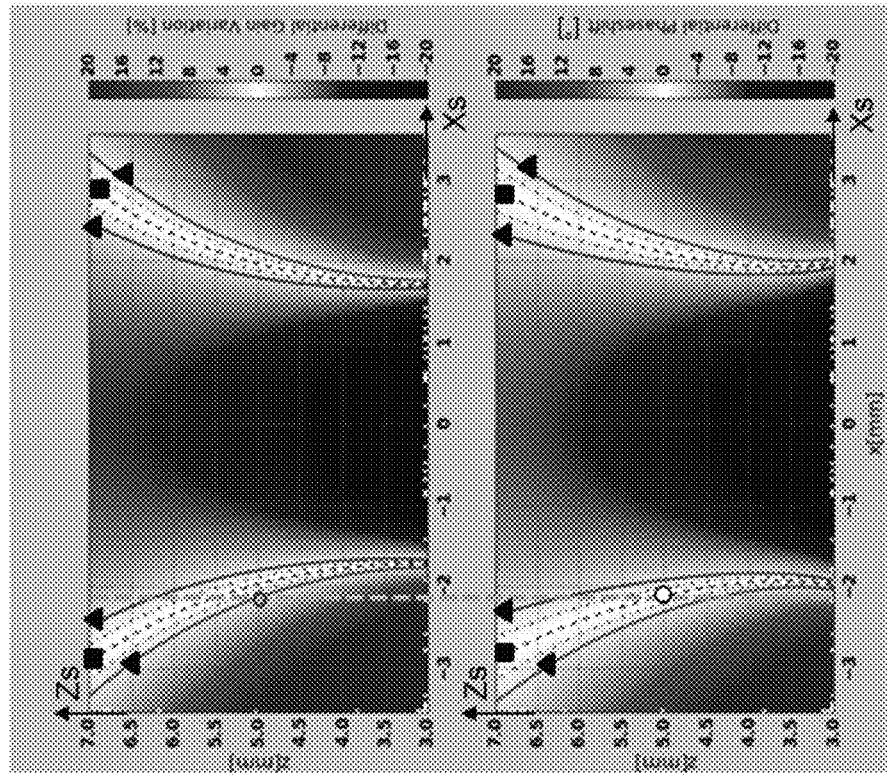
Figure 4B:
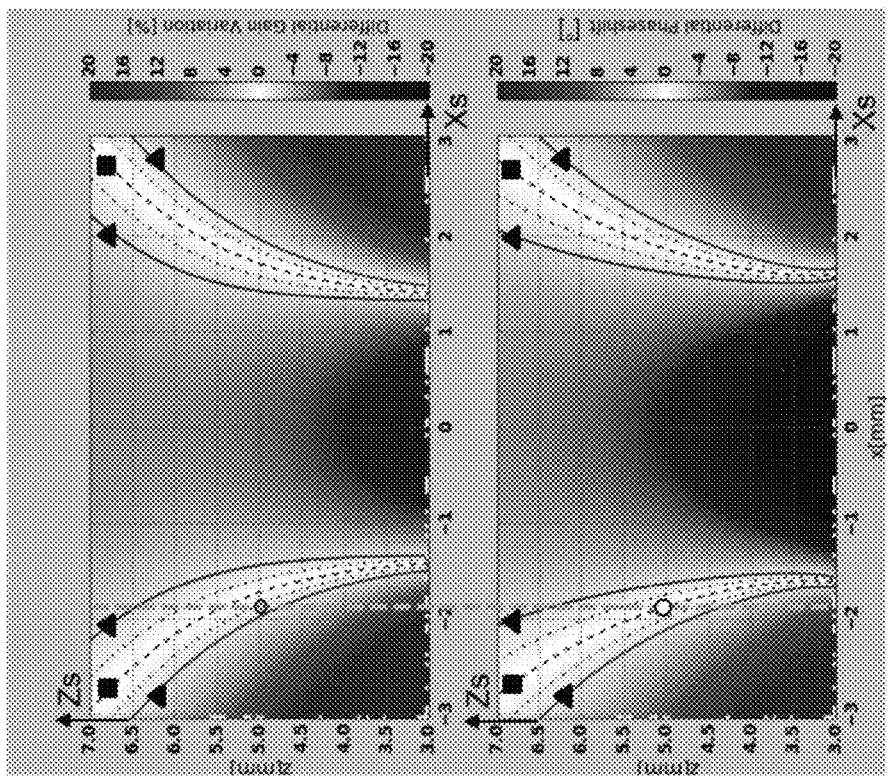

In FIG. 4(b) the X-position where the phase shift is 0° is indicated by a white circle. If the sensor is located at Z=5 mm, the attenuation deviation will be approximately +1%.

In FIG. 4(c) the X-position where the phase shift is 0° is again indicated by a white circle. If the sensor is located at Z=5 mm, the attenuation deviation will be approximately +2%. It may be better to shift the sensor device somewhat closer to the middle, to slightly decrease the attenuation deviation, at the expense of a slight increase of the phase shift.

As can be appreciated from FIG. 4(b) and FIG. 4(c) there is still a considerable overlap of the ±2% attenuation region and the ±2° phase shift region, i.e. between the curves with triangles of the upper graph and the lower graph, for various Z-positions.

Figure 4E:
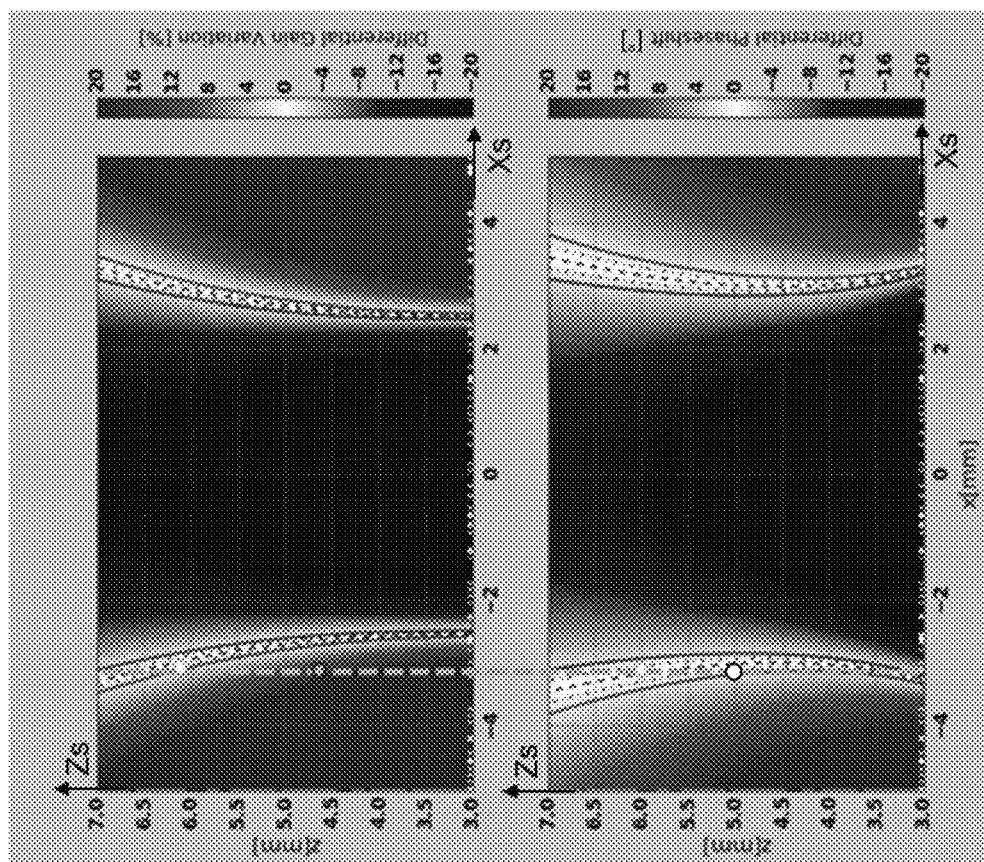
Figure 4D:
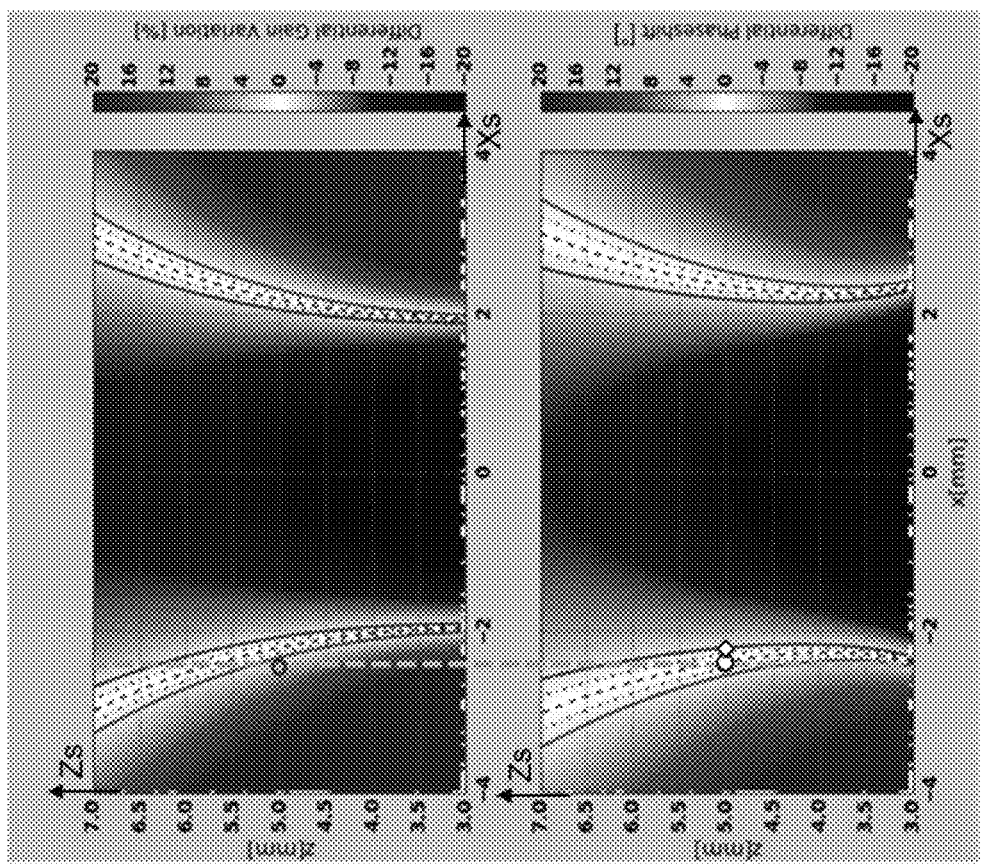

Things become slightly different in FIG. 4(d). As can be seen, when Z=5.0 mm, if the sensor is located with its reference point "R" at the location of the white circle (where the phase shift is) 0°, the attenuation will deviate outside the ±2% region, but such a sensor system still provides an excellent AC response which is much more accurate than prior art solutions. There are several options. One option is to maintain this Z and X-position and allow a somewhat larger tolerance margin. Another option is to maintain the Z-position, but shift the X-position slightly inwards, to the location of the diamond. This will slightly increase the phase shift, but the attenuation deviation will shift into the "±2% tolerance region". Yet another option is to choose a larger Z-position, for example Z=5.5 mm.

As can be appreciated from FIG. 4(e), locating the reference point R of the sensor device at Z=5.0 mm, and at the location where the phase shift is equal to 0° causes a relatively large attenuation deviation (in the order of about 10%). Based on the graph of FIG. 4(e), it would seem better to locate the sensor such that its reference point R is located at Z=6.0 mm or higher, but in practice, at such high distance from the busbar, the signals may become relatively weak, and the SNR may become important. Thus, rather than increasing the Z-value, it may be better to increase the tolerance margins to for example ±3%, or ±4%, and keep the Z-value smaller than 5.0 mm.

The trade-off between smaller distance Zs (thus larger signal-strength, smaller SNR) versus larger attenuation and/or phase shift error, does not only apply to busbars having a width of 10 mm, but also applies to smaller busbars.

It is noted that the simulations of FIG. 4(a) to FIG. 4(e) are performed for a busbar having a thickness T=3 mm, but of course, the present invention is not limited thereto, and is also applicable for busbars having another thickness in the range from about 2.0 mm to about 5.0 mm, for example T=2.5 mm, or T=3.0 mm, or T=3.5 mm, or T=4.0 mm, or T=4.5 mm, or T=5.0 mm. Similar simulations can be performed, but not all combinations of thickness and width have to be simulated, because the magnetic field around a busbar having a thickness T=3.0 mm and a width W=6.0 mm (for example) will look the same as the magnetic field around a busbar having a thickness T=2.0 mm and a width W=4.0 mm after scaling. This means that FIG. 4(a) not only shows how the magnetic field looks around a busbar having T=3.0 mm and W=5.0 mm, but also shows how the magnetic field looks around a busbar with T=2.0 mm and W=3.33 mm; or around a busbar with T=4.0 mm and W=6.67 mm, or around a busbar with T=6.0 mm and W=10.0 mm, etc.

It is furthermore noted that the simulations of FIG. 2(a) to FIG. 2(c) and FIG. 4(a) to FIG. 4(e) are performed for a predefined distance dx between the magnetic sensor elements of about 2.2 mm, but the present invention is not limited thereto, and the invention will also work for other distances, e.g. distances in the range from 0.5 mm to 4.0 mm, or in the range from 1.0 mm to 3.0 mm, or in the range from 1.5 mm to 2.5 mm, e.g. equal to about 1.5 mm, or equal to about 1.6 mm, or equal to about 1.7 mm, or equal to about 1.8 mm, or equal to about 1.9 mm, or equal to about 2.0 mm, or equal to about 2.1 mm, or equal to about 2.2 mm, or equal to about 2.3 mm. As a rule of thumb, a larger distance dx typically causes a larger magnitude of the differential signal |ΔBz|, thus will typically yield a slightly better signal-to-noise ratio (SNR) but requires a larger chip. A trade-off can be made between accuracy and cost.

In each case, the skilled person having the benefit of the present disclosure, can easily perform simulations like those described above, to find an optimal position for other parameters, for example for another value of dx.

FIG. 5 shows a table corresponding to the graphs of FIG. 4(a) to FIG. 4(e), showing the ideal lateral position of the sensor device for achieving 0% attenuation variations, and the ideal position for achieving 0° phase shift, for a distance Zs of 3, 4 or 5 mm from the busbar. As can be seen, these ideal positions are not exactly the same, but are located close to each other.

From FIG. 4(a) to FIG. 4(d) it can be appreciated that the present invention provides an excellent AC behaviour especially for busbars having an aspect ratio W/T in the range from about 1.67 to about 2.67, but the present invention is not limited hereto, and will also provide a very good AC behaviour, or simply a good AC behaviour for busbars having an aspect ratio W/T higher than 2.67, or smaller than 1.67. As already suggested above, the skilled person can make a trade-off (or compromise) between (i) large signal strength (small Zs) but slightly larger error on the one hand, and (ii) smaller signal strength (larger Zs) but smaller error. This is especially true for busbars having a W/T ratio smaller than 1.67 or larger than 2.67. It is noted in this respect, that the present invention also encompasses busbars having a width W in the range from 3.0 mm to 12.0 mm, for example having a width W=3.0 mm, or W=3.5 mm, or W=4.0 mm, or W=4.5 mm, or W=11 mm, or W=12 mm.

While the principles of the present invention are illustrated and explained above in sufficient detail for a skilled person to work the invention, the graphs of FIG. 4(a) to FIG. 4(e) may not be the best way to clearly define the scope of protection. The inventors performed additional simulations, for Z-values ranging from 0.5 to 4.0 mm and combined the 0% attenuation deviation curves for various W in a single graph (see FIG. 6(a), FIG. 7(a), FIG. 8(a) and FIG. 9(a)) as a function of the parameters Zs and ds. Likewise, the 0° phase shift curves for various W are combined in a single graph (see FIG. 6(b), FIG. 7(b), FIG. 8(b) and FIG. 9(b)) as a function of the parameters Zs and ds. These graphs allow to better define the scope of protection by means of rectangular regions, which is practical to describe, and to verify.

Figure 6A:
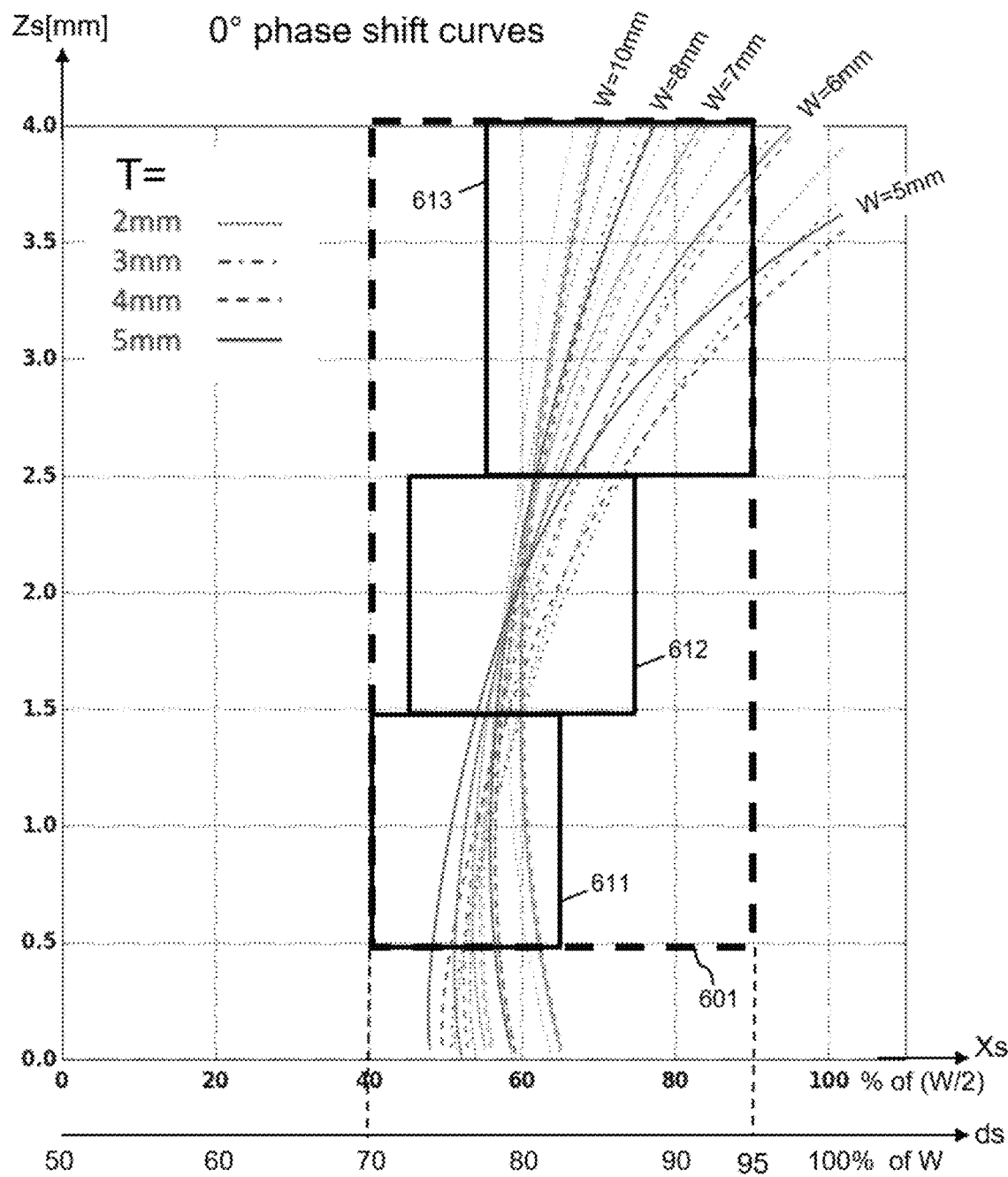
FIG. 6(a) shows "0° phase shift curves"
Figure 6B:
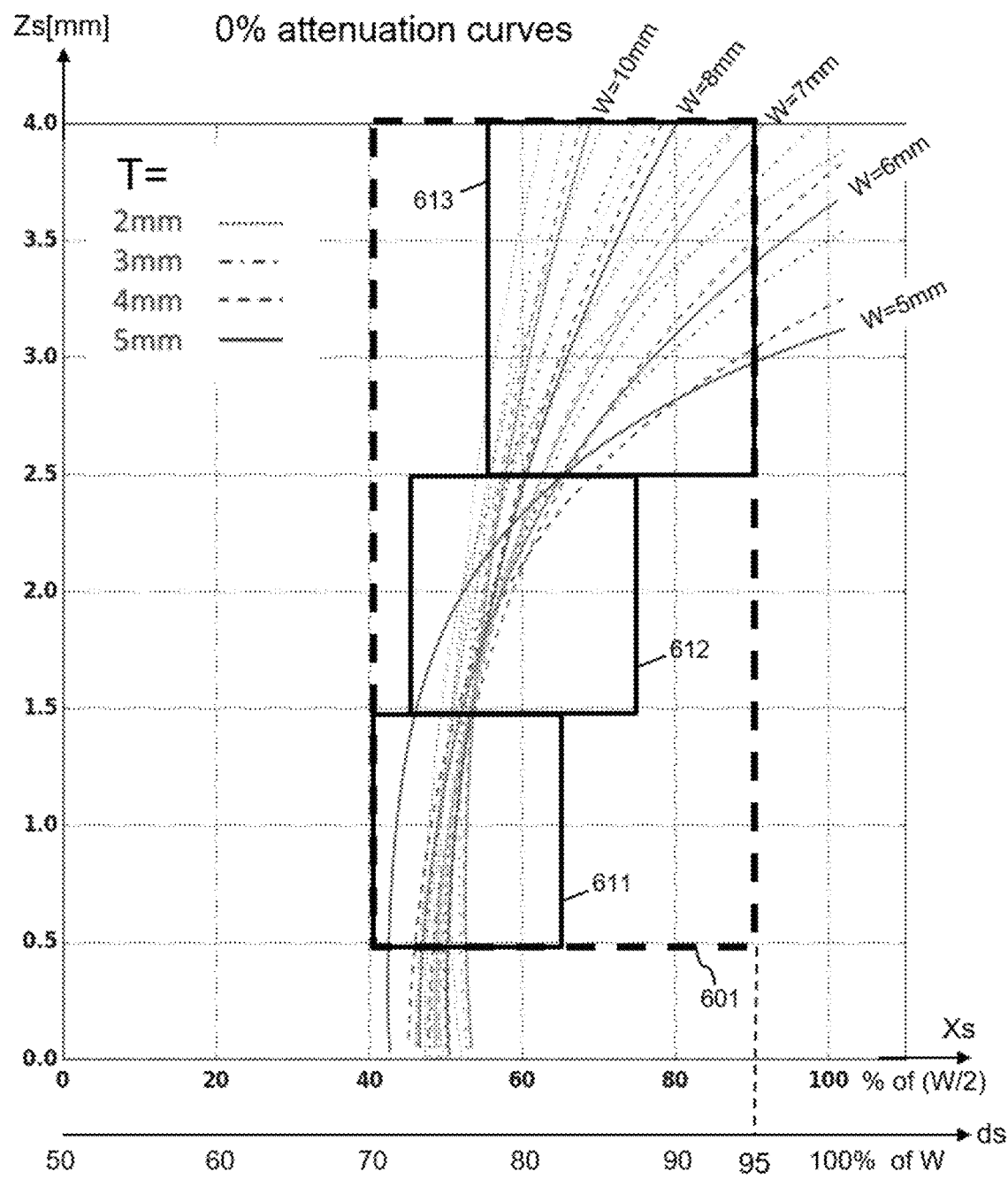
FIG. 6(b) shows "0% attenuation curves" for busbars having a thickness T from 2 mm to 5 mm and having a width W from 5 mm to 10 mm, for various positions of the sensor device relative to the busbar. Also indicated are "preferred regions" where a reference point of the sensor device is to be located according to embodiments of the present invention.

FIG. 6(a) shows "0° phase shift curves", and FIG. 6(b) shows "0% attenuation deviation curves" for busbars having a width W varying from 5 mm to 10 mm and having a thickness T ranging from 2 mm to 5 mm (as indicated in the legend), for various distances Zs from the busbar varying from 0.0 mm to 4.0 mm and lateral positions Xs (or ds).

Four preferred rectangular regions 601, 611, 612, 613 are indicated. According to embodiments of the present invention, a reference point of the sensor device as defined above, is to be located in one of these rectangular zones. Since multiple parameters are involved, the following table explicitly lists combinations of parameters for these regions.

TABLE 1a combination of parameters of preferred embodiments shown in FIG. 6(a) and FIG. 6(b)

| Zs [mm] | dx [mm] | W [mm] | T [mm] | ds [% ofW] | zone |
|---|---|---|---|---|---|
| 0.5 to 4.0 | 0.5 to 2.5 | 5.0 to 10.0 | 2.0 to 5.0 | 70% to 95% | 601 |
| 0.5 to 3.5 | 0.5 to 2.5 | 5.0 to 10.0 | 2.0 to 5.0 | 70% to 95% | part of 601 |
| 0.5 to 1.5 | 0.5 to 2.5 | 5.0 to 10.0 | 2.0 to 5.0 | 70% to 83% | 611 |
| 1.5 to 2.5 | 0.5 to 2.5 | 5.0 to 10.0 | 2.0 to 5.0 | 72% to 88% | 612 |
| 2.5 to 4.0 | 0.5 to 2.5 | 5.0 to 10.0 | 2.0 to 5.0 | 77% to 95% | 613 |
| 0.5 to 4.0 | 1.0 to 2.5 | 5.0 to 10.0 | 2.0 to 5.0 | 70% to 95% | 601 |
| 0.5 to 3.5 | 1.0 to 2.5 | 5.0 to 10.0 | 2.0 to 5.0 | 70% to 95% | part of 601 |
| 0.5 to 1.5 | 1.0 to 2.5 | 5.0 to 10.0 | 2.0 to 5.0 | 70% to 83% | 611 |
| 1.5 to 2.5 | 1.0 to 2.5 | 5.0 to 10.0 | 2.0 to 5.0 | 72% to 88% | 612 |
| 2.5 to 4.0 | 1.0 to 2.5 | 5.0 to 10.0 | 2.0 to 5.0 | 77% to 95% | 613 |
| 0.5 to 4.0 | 1.5 to 2.5 | 5.0 to 10.0 | 2.0 to 5.0 | 70% to 95% | 601 |
| 0.5 to 3.5 | 1.5 to 2.5 | 5.0 to 10.0 | 2.0 to 5.0 | 70% to 95% | part of 601 |
| 0.5 to 1.5 | 1.5 to 2.5 | 5.0 to 10.0 | 2.0 to 5.0 | 70% to 83% | 611 |
| 1.5 to 2.5 | 1.5 to 2.5 | 5.0 to 10.0 | 2.0 to 5.0 | 72% to 88% | 612 |
| 2.5 to 4.0 | 1.5 to 2.5 | 5.0 to 10.0 | 2.0 to 5.0 | 77% to 95% | 613 |

In fact, as mentioned above, for some envisioned embodiments, the reference point R may be located substantially near the edge of the busbar (e.g. ds=100%), or even slightly beyond the edge (e.g. ds=110%). In its broadest form, the present invention can therefore be described by the following set of parameters (see table 1b).

It is noted that the value of T has to be chosen smaller than or equal to W. Thus W=3.0 to 10.0 mm and T=2.0 to 5.0 mm means in fact that, if W=3.0 mm, then T=2.0 to 3.0 mm; and if W=4.0 mm, then T=2.0 mm to 4.0 mm; if W=6.5 mm, then T=2.0 mm to 5.0 mm. This is indicated by "T≤W" in the table header.

TABLE 1b combination of parameters of embodiments according to the present invention.

| Zs [mm] | dx [mm] | W [mm] | T [mm], but T ≤ W | ds [% ofW] | zone |
|---|---|---|---|---|---|
| 0.5 to 4.0 | 0.5 to 2.5 | 3.0 to 10.0 | 2.0 to 5.0 | 70% to 110% | (not indicated) |
| 0.5 to 4.0 | 0.5 to 2.5 | 4.0 to 10.0 | 2.0 to 5.0 | 70% to 110% | (not indicated) |

Figure 7A:
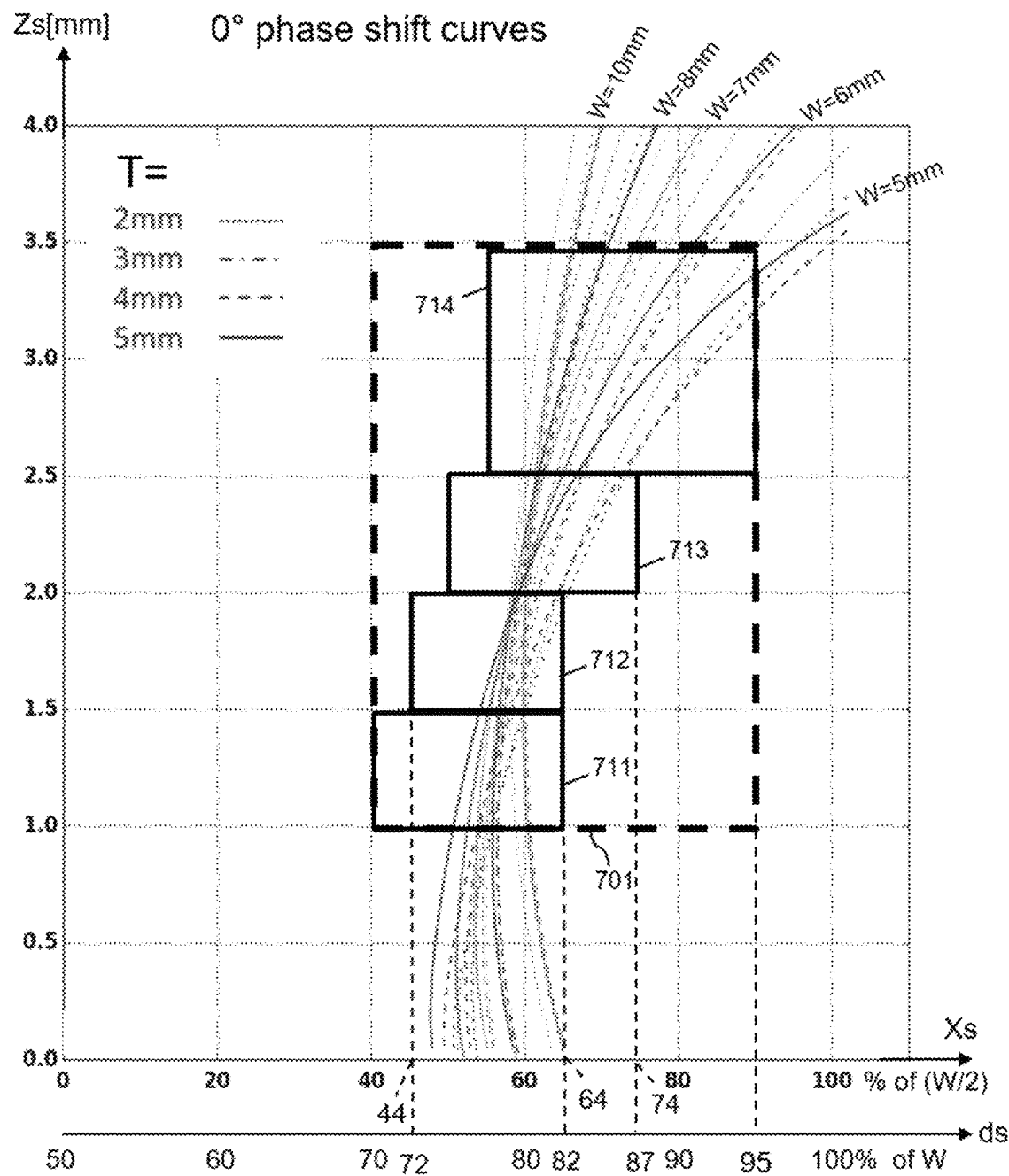
FIG. 7(a) and FIG. 7(b) show the same plots as FIG. 6(a) and FIG. 6(b) respectively, with smaller "preferred regions" where a reference point of the sensor device is to be located according to embodiments of the present invention.
Figure 7B:
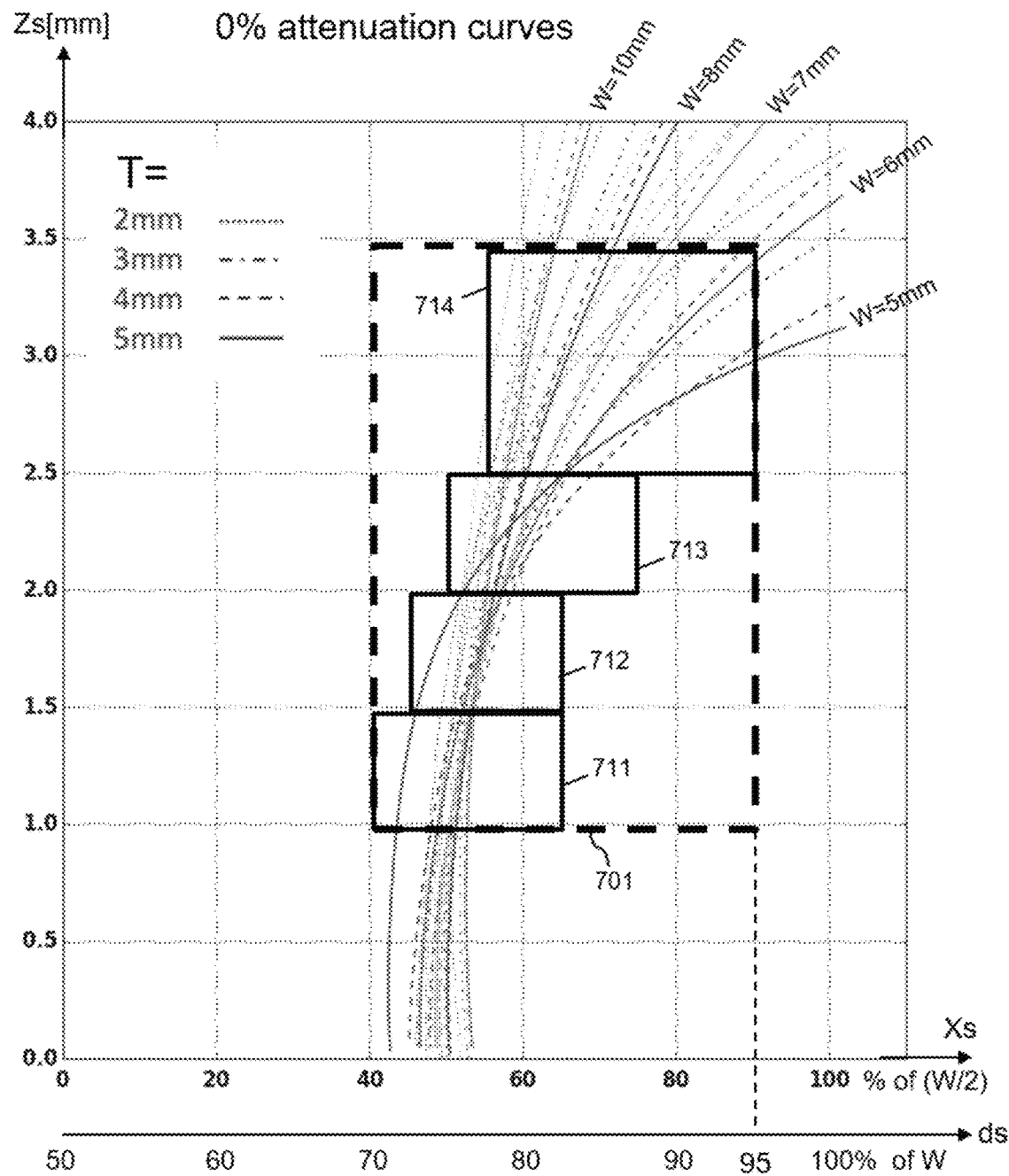

FIG. 7(a) and FIG. 7(b) show the same plots as FIG. 6(a) and FIG. 6(b) respectively, overlaid by smaller rectangular regions 701, 711, 712, 713, 714 of where a reference point R of the sensor device is to be located, according to embodiments of the present invention. The following table explicitly lists combinations of parameters for these regions.

TABLE 2 combination of parameters of preferred embodiments shown in FIG. 7(a) and FIG. 7(b)

| Zs [mm] | dx [mm] | W [mm] | T [mm] | ds [% ofW] | zone |
|---|---|---|---|---|---|
| 1.0 to 3.5 | 0.5 to 2.5 | 5 to 10 | 3 to 5 | 70% to 95% | 701 |
| 1.0 to 1.5 | 0.5 to 2.5 | 5 to 10 | 3 to 5 | 70% to 83% | 711 |
| 1.5 to 2.0 | 0.5 to 2.5 | 5 to 10 | 3 to 5 | 72% to 83% | 712 |
| 2.0 to 2.5 | 0.5 to 2.5 | 5 to 10 | 3 to 5 | 75% to 88% | 713 |
| 2.5 to 3.5 | 0.5 to 2.5 | 5 to 10 | 3 to 5 | 77% to 95% | 714 |
| 1.0 to 3.5 | 1.0 to 2.5 | 5 to 10 | 3 to 5 | 70% to 95% | 701 |
| 1.0 to 1.5 | 1.0 to 2.5 | 5 to 10 | 3 to 5 | 70% to 83% | 711 |
| 1.5 to 2.0 | 1.0 to 2.5 | 5 to 10 | 3 to 5 | 72% to 83% | 712 |
| 2.0 to 2.5 | 1.0 to 2.5 | 5 to 10 | 3 to 5 | 75% to 88% | 713 |
| 2.5 to 3.0 | 1.0 to 2.5 | 5 to 10 | 3 to 5 | 77% to 95% | 714 |
| 1.0 to 3.5 | 1.5 to 2.5 | 5 to 10 | 3 to 5 | 70% to 95% | 701 |
| 1.0 to 1.5 | 1.5 to 2.5 | 5 to 10 | 3 to 5 | 70% to 83% | 711 |

TABLE 2-continued combination of parameters of preferred embodiments shown in FIG. 7(a) and FIG. 7(b)

| Zs [mm] | dx [mm] | W [mm] | T [mm] | ds [% ofW] | zone |
|---|---|---|---|---|---|
| 1.5 to 2.0 | 1.5 to 2.5 | 5 to 10 | 3 to 5 | 72% to 83% | 712 |
| 2.0 to 2.5 | 1.5 to 2.5 | 5 to 10 | 3 to 5 | 75% to 88% | 713 |
| 2.5 to 3.0 | 1.5 to 2.5 | 5 to 10 | 3 to 5 | 77% to 95% | 714 |

Figure 8A:
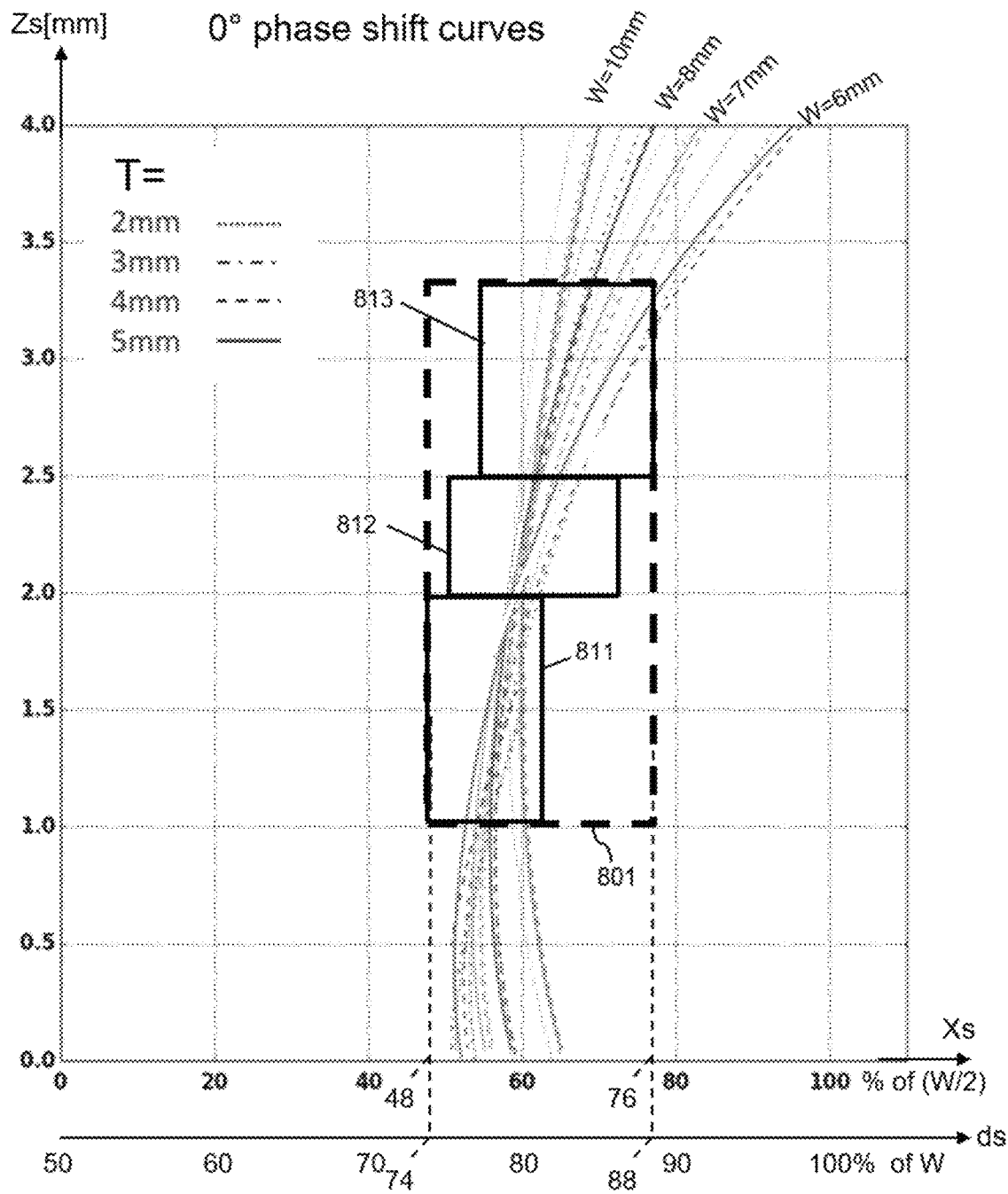
FIG. 8(a) and FIG. 8(b) show a subset of the plots of FIG. 6(a) and FIG. 6(b), for busbar widths from 6 to 10 mm, and smaller "preferred regions" where a reference point of the sensor device is to be located according to embodiments of the present invention.
Figure 8B:
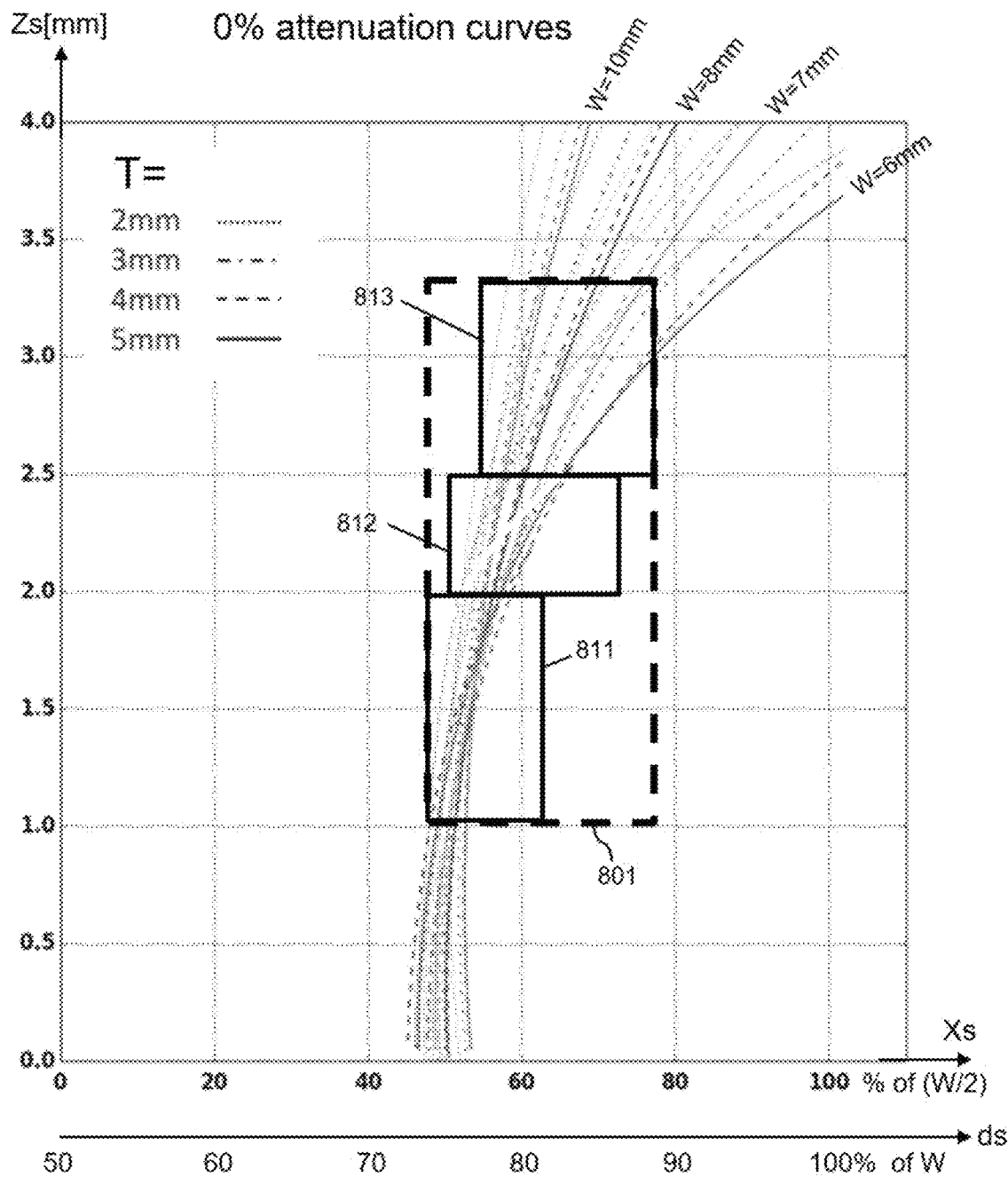

FIG. 8(a) and FIG. 8(b) show a subset of the plots of FIG. 6(a) and FIG. 6(b), for busbar widths from 6 to 10 mm, overlaid by smaller rectangular regions 801, 811, 812, 813 of where a reference point R of the sensor device is to be located, according to embodiments of the present invention.

The following table explicitly lists combinations of parameters for these regions.

TABLE 3 combination of parameters of preferred embodiments shown in FIG. 8(a) and FIG. 8(b)

| Zs [mm] | dx [mm] | W [mm] | T [mm] | ds [% ofW] | zone |
|---|---|---|---|---|---|
| 1.0 to 3.3 | 0.5 to 2.5 | 6 to 10 | 3 to 5 | 74% to 88% | 801 |
| 1.0 to 2.0 | 0.5 to 2.5 | 6 to 10 | 3 to 5 | 74% to 81% | 811 |
| 2.0 to 2.5 | 0.5 to 2.5 | 6 to 10 | 3 to 5 | 75% to 86% | 812 |
| 2.5 to 3.3 | 0.5 to 2.5 | 6 to 10 | 3 to 5 | 77% to 88% | 813 |
| 1.0 to 3.3 | 1.0 to 2.5 | 6 to 10 | 3 to 5 | 74% to 88% | 801 |
| 1.0 to 2.0 | 1.0 to 2.5 | 6 to 10 | 3 to 5 | 74% to 81% | 811 |
| 2.0 to 2.5 | 1.0 to 2.5 | 6 to 10 | 3 to 5 | 75% to 86% | 812 |
| 2.5 to 3.3 | 1.0 to 2.5 | 6 to 10 | 3 to 5 | 77% to 88% | 813 |
| 1.0 to 3.3 | 1.5 to 2.5 | 6 to 10 | 3 to 5 | 74% to 88% | 801 |
| 1.0 to 2.0 | 1.5 to 2.5 | 6 to 10 | 3 to 5 | 74% to 81% | 811 |
| 2.0 to 2.5 | 1.5 to 2.5 | 6 to 10 | 3 to 5 | 75% to 86% | 812 |
| 2.5 to 3.3 | 1.5 to 2.5 | 6 to 10 | 3 to 5 | 77% to 88% | 813 |

Figure 9A:
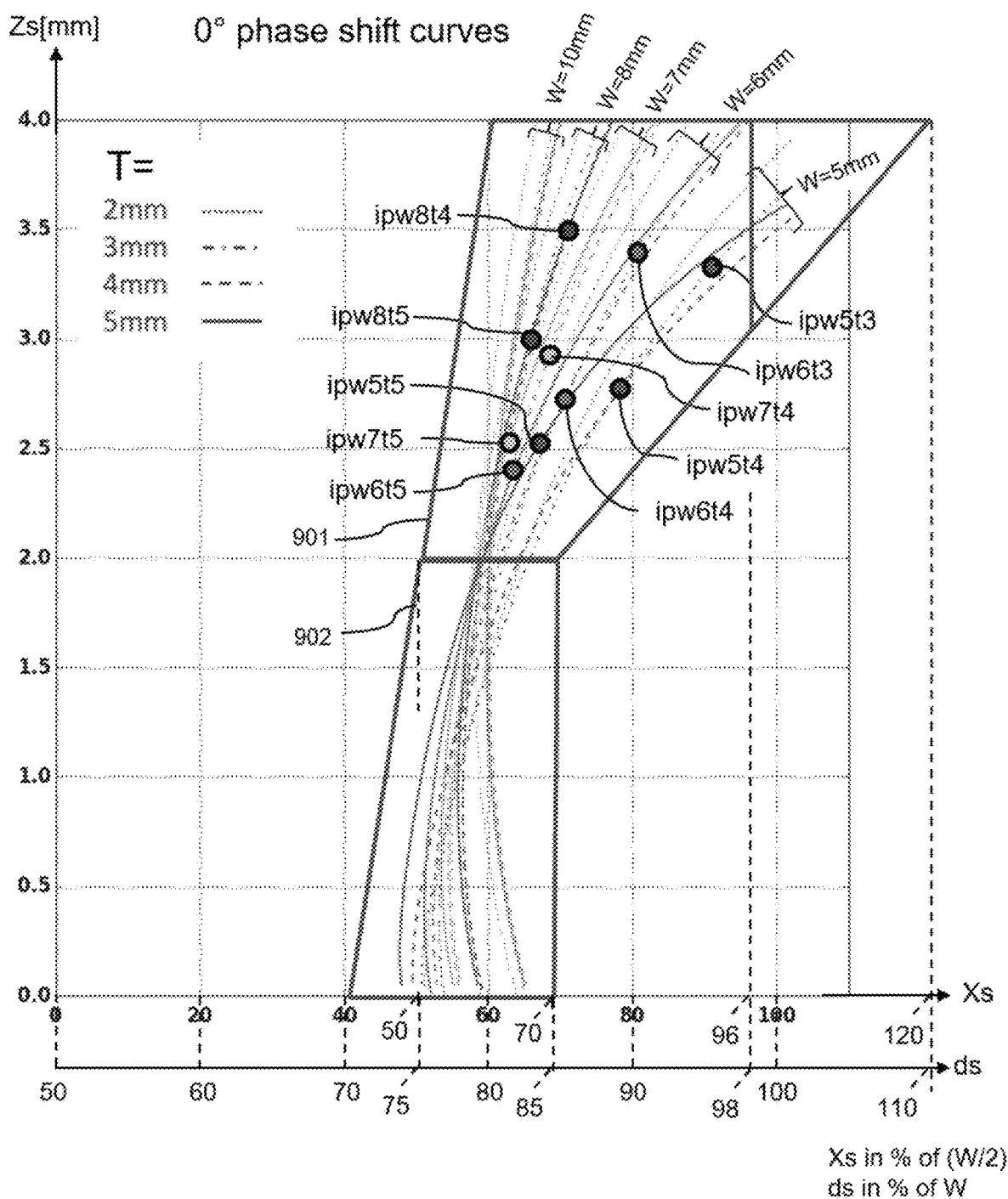
FIG. 9(a) and FIG. 9(b) show the plots of FIG. 6(a) and FIG. 6(b), and show the location of exemplary "sweet spots" where the attenuation deviation is 0% and the phase shift is 0° for certain busbars having a thickness T from 2 to 5 mm and a width W from 5 to 10 mm, and shows a narrow "region" around some of the sweet spots where a reference point of the sensor device is to be located according to some embodiments of the present invention.
Figure 9B:
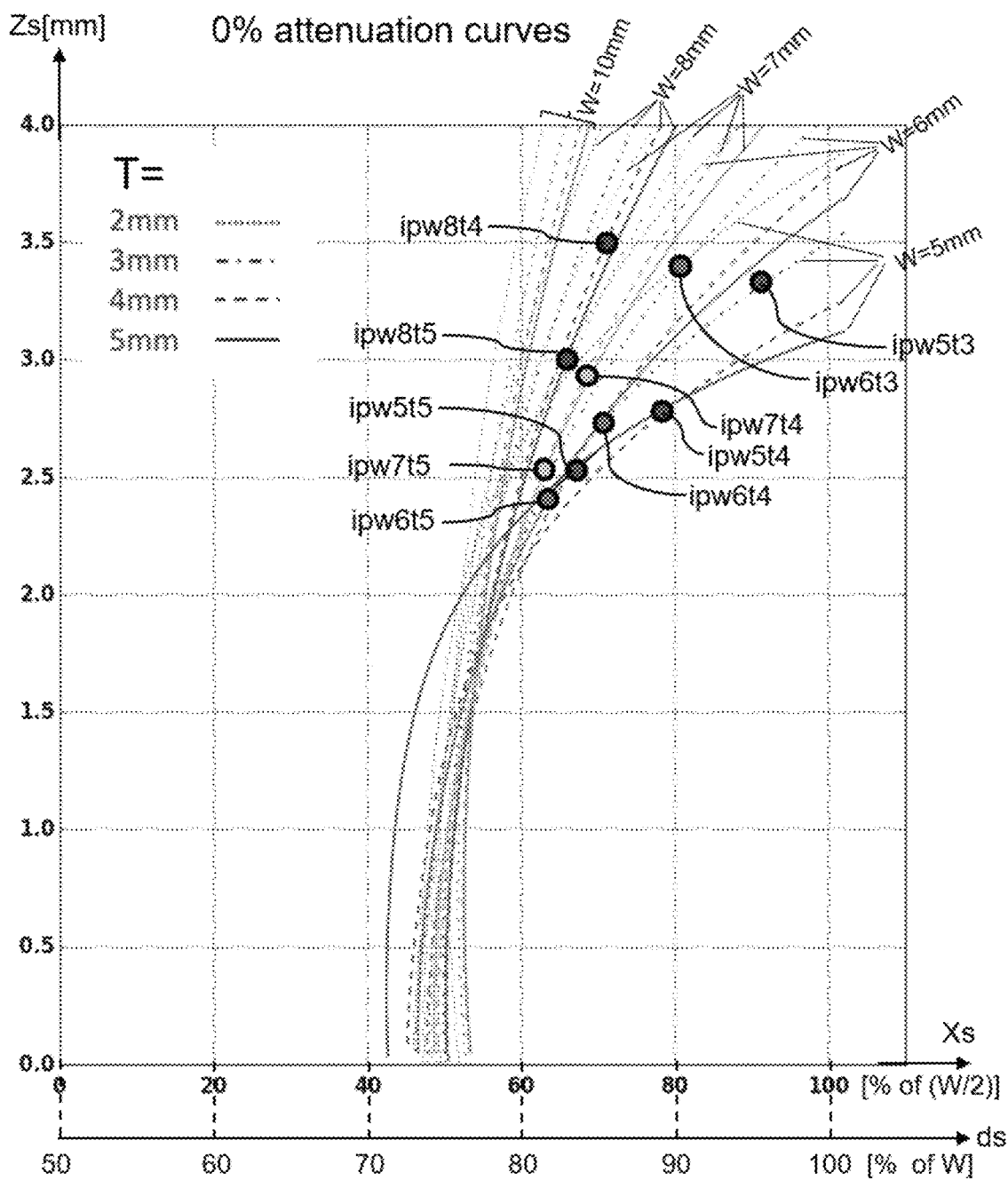

FIG. 9(a) and FIG. 9(b) show the plots of FIG. 6(a) and FIG. 6(b), for busbar widths from 5 to 10 mm, and in addition show the locations of several exemplary "sweet spots" where the attenuation deviation is 0% and the phase shift is 0°. These "sweet spots" can be found, for a busbar having a particular thickness T and a particular width W, at the intersection of the attenuation deviation curve and the phase shift curve. (e.g. by overlapping the drawing of FIG. 9(a) and the drawing of FIG. 9(b)). The label of point "ipw6t5" stands for "intersection point for W=6 mm and T=5 mm", etc.

It is explicitly pointed out, however, that it is not required to position the sensor device exactly in the sweet spot in order to obtain good AC response. Indeed, for many applications, an attenuation deviation of ±4% and a phase shift of ±4% may well be acceptable.

Also shown are an upper region 901, having a trapezoidal shape defined by interconnecting the following four points by straight lines: (ds=80%, Zs=4.0 mm), (ds=110%, Zs=4.0 mm), (ds=85%, Zs=2.0), (ds=75%, Zs=2.0 mm);

and a truncated version of this region, defined by interconnecting the following five points by straight lines: (ds=80%, Zs=4.0 mm), (ds=98%, Zs=4.0 mm), (ds=98%, Zs=3.0 mm), (ds=85%, Zs=2.0 mm), (ds=75%, Zs=2.0 mm);

and a lower region 902, having a trapezoidal shape defined by interconnecting the following four points by straight lines: (ds=70%, Zs=0.0 mm), (ds=75%, Zs=2.0 mm), (ds=85%, Zs=2.0 mm), (ds=85%, Zs=0.0 mm).

The present invention can also be expressed in terms of these regions, namely by stating that according to the principles of the present invention, the reference point "R" of the sensor device is to be located in any of these shapes; or in "close vicinity" of the sweet spots shown in FIG. 9(a), for example at a position deviating at most ±1.0 mm in the X and/or Z-direction from the 0% and 0° positions; or at a position deviating at most ±0.75 mm in the X and/or Z-direction from the 0% and 0° positions; or at a position deviating at most ±0.5 mm in the X and/or Z-direction from the 0% and 0° positions; or at a position deviating at most ±0.3 mm in the X and/or Z-direction from the 0% and 0° positions.

In certain embodiments of the present invention, the distance dx and the position of the reference point are chosen such that both sensor elements H1, H2 are located "above" the busbar. This may be added as an additional limitation to all of the above embodiments.

In certain embodiments of the present invention, the distance dx and the position of the reference point are chosen such that one sensor elements is located "above" the busbar, while the other sensor element is located "next to" the busbar. This may be added as an additional limitation to all of the above embodiments.

With "above the busbar" is meant that a projection of the position of the magnetic sensor element in the direction of the Z-axis (see FIG. 3(b) and FIG. 3(c)) intersects the busbar. With "next to the busbar" is meant that a projection of the position of the magnetic sensor element in the direction of the Z-axis (see FIG. 3(b) and FIG. 3(c)) does not intersect the busbar.

Whether the two sensors are located "above" the busbar or not, can easily be verified by means of the parameters dx, W, and ds. A few examples are given in the following table (this list is not exhaustive):

TABLE 5 exemplary combinations of parameters to indicate whether the two sensor elements are located "above" the busbar, or "next to" the busbar, or "on the edge" of the busbar.

| dx [mm] | W [mm] | ds [mm] | d1 = ds − (dx/2) [mm] | d2 = Xs + dx/2 [mm] | above busbar? |
|---|---|---|---|---|---|
| 1.0 | 5.0 | @75% W = 3.75 | 3.75 − 0.5 = 3.25 | 3.75 + 0.5 = 4.25 | both above |
| 1.0 | 5.0 | @80% W = 24.0 | 4.0 − 0.5 = 3.5 | 4.0 + 0.5 = 4.5 | both above |
| 1.0 | 5.0 | @95% W = 4.75 | 4.75 − 0.5 = 4.25 | 4.75 + 0.5 = 5.25 | 1 above, 1 next to |
| 1.0 | 6.0 | @80% W = 4.8 | 4.8 − 0.5 = 4.3 | 4.8 + 0.5 = 5.3 | both above |
| 1.0 | 10.0 | @80% W = 4.8 | 8.0 − 0.5 = 7.5 | 8.0 + 0.5 = 8.5 | both above |
| 2.0 | 5.0 | @75% W = 3.75 | 3.75 − 1.0 = 2.75 | 3.75 + 1.0 = 4.75 | both above |
| 2.0 | 5.0 | @80% W = 4.0 | 4.0 − 1.0 = 3.0 | 4.0 + 1.0 = 5.0 | 1 above, 1 on edge |
| 2.0 | 5.0 | @90% W = 4.5 | 4.5 − 1.0 = 3.5 | 4.5 + 1.0 = 5.5 | 1 above, 1 next to |
| 2.0 | 6.0 | @75% W = 4.5 | 4.5 − 1.0 = 3.5 | 4.5 + 1.0 = 5.5 | both above |
| 2.0 | 6.0 | @80% W = 4.8 | 4.8 − 1.0 = 3.8 | 4.8 + 1.0 = 5.8 | both above |

TABLE 5-continued exemplary combinations of parameters to indicate whether the two sensor elements are located "above" the busbar, or "next to" the busbar, or "on the edge" of the busbar,

| dx [mm] | W [mm] | ds [mm] | d1 = ds − (dx/2) [mm] | d2 = Xs + dx/2 [mm] | above busbar? |
|---|---|---|---|---|---|
| 2.0 | 6.0 | @90% W = 5.4 | 5.4 − 1.0 = 4.4 | 5.4 + 1.0 = 6.4 | 1 above, 1 next to |
| 2.0 | 8.0 | @75% W = 6.0 | 6.0 − 1.0 = 5.0 | 6.0 + 1.0 = 7.0 | both above |
| 2.0 | 8.0 | @80% W = 6.4 | 6.4 − 1.0 = 5.4 | 6.4 + 1.0 = 7.4 | both above |
| 2.2 | 5.0 | @75% W = 3.75 | 3.75 − 1.1 = 2.65 | 3.75 + 1.1 = 4.85 | both above |
| 2.2 | 5.0 | @80% W = 4.0 | 4.0 − 1.1 = 2.9 | 4.0 + 1.1 = 5.1 | 1 above, 1 next to |
| 2.2 | 6.0 | @75% W = 4.5 | 4.5 − 1.1 = 3.4 | 4.5 + 1.1 = 5.6 | both above |
| 2.2 | 6.0 | @80% W = 4.8 | 4.8 − 1.1 = 3.7 | 4.8 + 1.1 = 5.9 | both above |
| 2.2 | 8.0 | @75% W = 6.0 | 6.0 − 1.1 = 4.9 | 6.0 + 1.1 = 7.1 | both above |
| 2.2 | 8.0 | @80% W = 6.4 | 6.4 − 1.1 = 5.3 | 6.4 + 1.1 = 7.5 | both above |

Figure 10A:
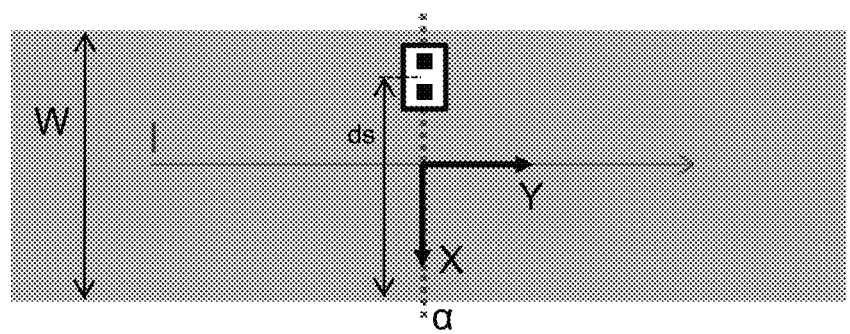
FIG. 10(a) to FIG. 10(e) show various busbars in top view. The busbar of FIG. 10(a) is a straight busbar. The busbar of FIG. 10(c) has a single cut-out (or notch). The busbars of FIG. 10(b), 10(d), 10(e) have two cut-outs on opposite sides of the busbar. These busbars can also be used in embodiments of the present invention. The effective width Wp to be taken into account is indicated in each of these drawings.

FIG. 10(a) to FIG. 10(e) show various busbars in top view. The busbar of FIG. 10(a) is a straight busbar, extending in the Y-direction. The current flows in the Y-direction. The busbar has a rectangular cross-section in a plane α substantially perpendicular to the direction of the current flow. The width W of the busbar extends in the X-direction, as indicated.

According to the present invention, the sensor device is to be oriented such that the two sensor elements are located on the X-axis, which is transverse to the direction of the current. This allows the sensor device to measure the magnetic field gradient ΔBz/Δx along the X-direction. As mentioned above, the division by Δx can be omitted. Furthermore, the sensor device is to be located such that a distance "ds" between an (imaginary) reference point "R" between the two sensor elements and an edge of the busbar is a value in the range from 70% to 110% of the width W of the busbar, or a value in the range from 70% to 95% of the width W of the busbar, or a subrange hereof, as described above, depending on the height position (Zs) of the sensor device, and depending on the desired accuracy.

But the invention is not limited to purely straight busbars and can also be applied to busbars having a single cut-out or more than one cut-out, which may be applied to locally increase the current density. A few examples are shown. The busbar of FIG. 10(c) has a single cut-out. The busbars of FIG. 10(b), FIG. 10(d) and FIG. 10(e) have two cut-outs on opposite sides of the busbar. Note that these drawings are not necessarily drawn to scale.

Assuming the length Lc of the cut-out is at least 3.0 mm long, and the width of the narrow portion or the effective width Wp is at least 5.0 mm, the same principles as described above remain applicable, meaning that there is a location "in a banana shaped region" where ΔBz or dBz/dx is substantially independent of frequencies, but instead of the overall width W of the busbar, a "local width" Wp is to be taken into account, and the distance "ds" is to be measured relative to a "local side" of the narrowed portion of the busbar, as indicated in these drawings.

Figure 10B:
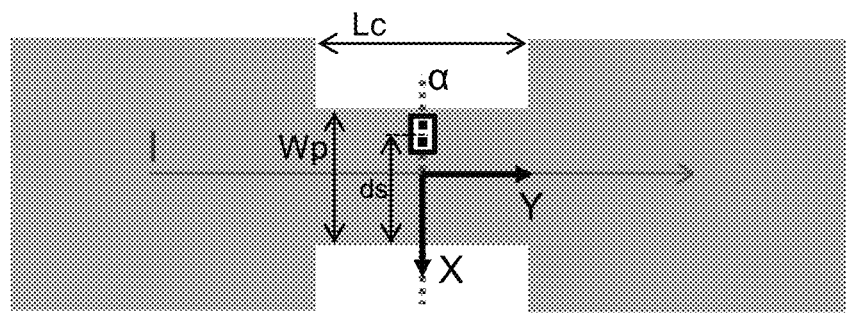
Figure 10C:
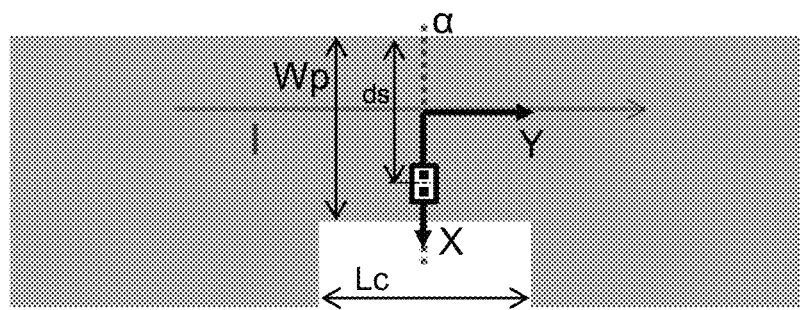
Figure 10D:
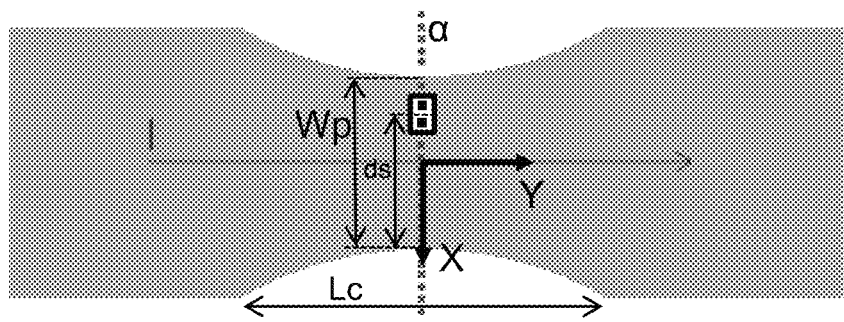
Figure 10E:
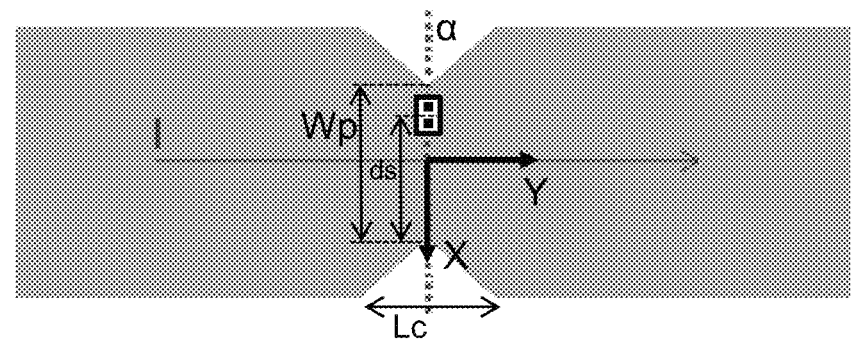
Figure 10F:
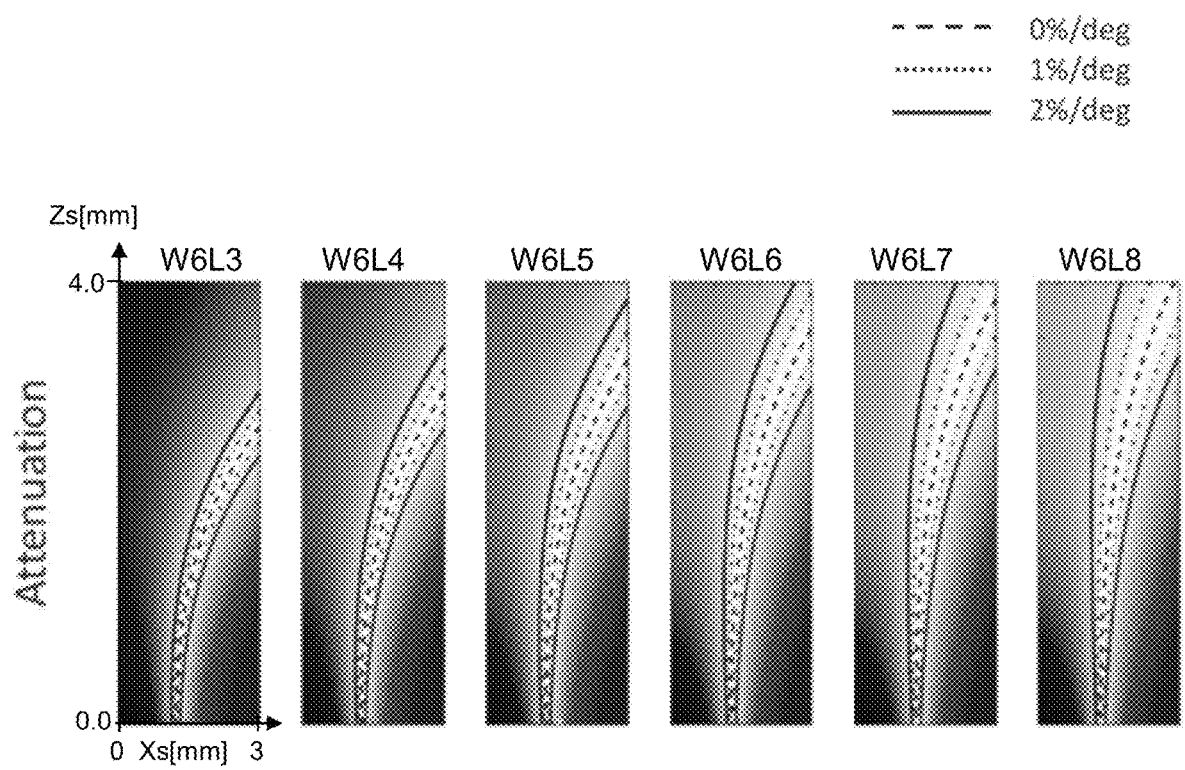
FIG. 10(f) and FIG. 10(g) show simulation results for the busbar of FIG. 10(b) having an effective width of 6 mm, and for a length of the cut-out ranging from 3 mm to 8 mm.
Figure 10G:
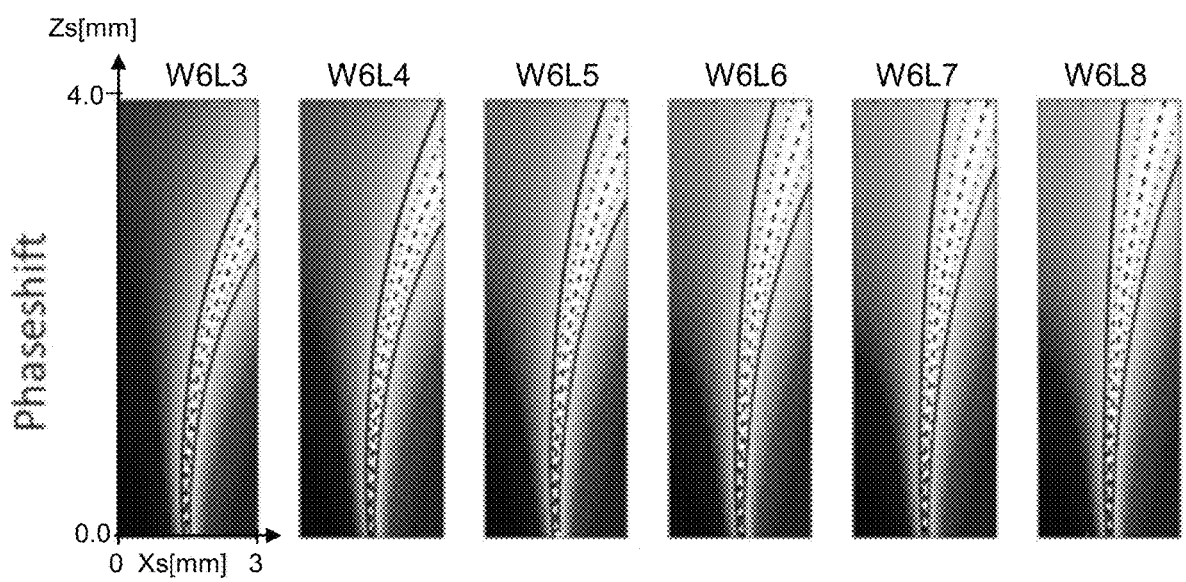

FIG. 10(f) and FIG. 10(g) show simulation results for the busbar of FIG. 10(b) having an effective width Wp of 6 mm, and for a length Lc of the cut-out ranging from 3 mm to 8 mm. The simulations shown are performed for a busbar having a thickness T of 3 mm, and for a distance dx between the sensor elements of 1.8 mm. As can be seen, "banana shaped" regions similar to the ones described above also occur in this case.

Although not shown, simulations were also performed for a busbar thickness T of 2 mm, yielding very similar results.

Figure 11A:
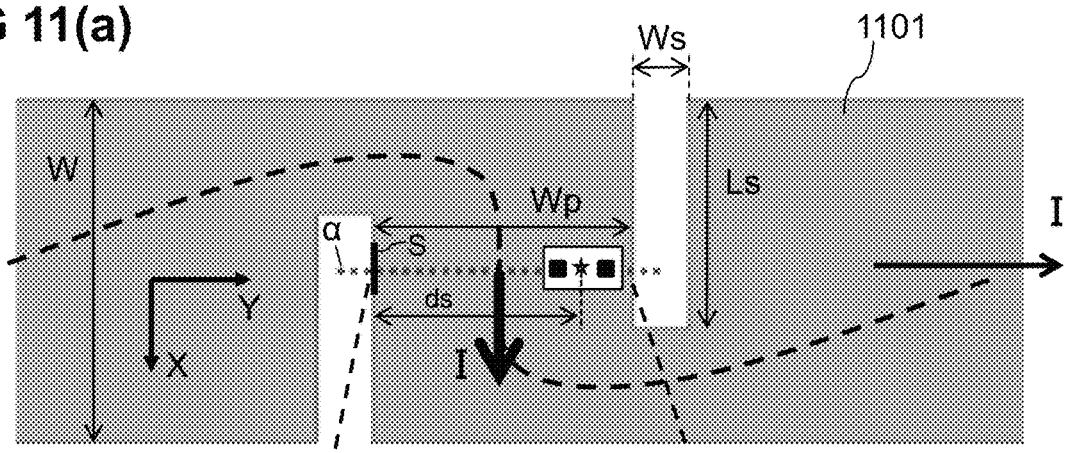
FIG. 11(a) shows a top view.
Figure 11B:
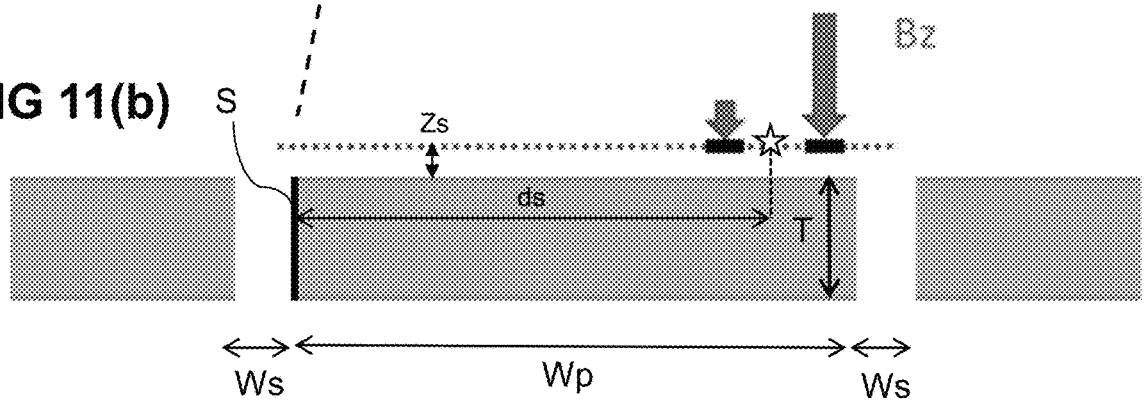
FIG. 11(b) shows a cross-sectional view of a portion of a busbar having two slits on opposite sides of the busbar, forming a zigzag passage of the current. This busbar can also be used in embodiments of the present invention, provided that the slits are sufficiently wide (in the Y direction), and sufficiently far apart from each other, and sufficiently deep (in the X direction). The effective width Wp to be taken into account is indicated in these drawings.

FIG. 11(a) shows a top view, and FIG. 11(b) shows a cross-sectional view of a portion of a busbar 1101 having two slits on opposite sides of the busbar, forming a zigzag passage for the current.

The present invention also works for this busbar 1101, in the same manner as described above, provided that the slits are sufficiently far apart from each other and are sufficiently deep (in the transverse direction X of the busbar) and are sufficiently wide (in the longitudinal direction Y of the busbar). The skilled person having the benefit of the present invention can easily find suitable slits by trial and error, or by performing simulations similar to those described above.

Near the position of the sensor device, the current I flows in the direction X. The busbar has a rectangular cross section (see FIG. 11(b)) in a cross-sectional plane α perpendicular to the direction of the current. This rectangular cross section defines a thickness T of the busbar and an effective width Wp. According to the principles of the present invention, the AC current flowing through the busbar can be measured with high or improved accuracy by orienting the sensor device such that the two sensor elements are located on a virtual line oriented in the Y-direction, and such that an imaginary reference point R in the middle between the two sensor elements is located at a distance "ds" from a side of the busbar, where "ds" is a value in the range from 70% to 110% or from 70% to 95% of the effective width Wp, or a subrange hereof (depending on the height position Zs). The exact position can be fine-tuned, by taking into account e.g. the distance Zs from the busbar, the Thickness T, and the maximum tolerance margin for the attenuation deviation and phase shift.

Figure 12A:
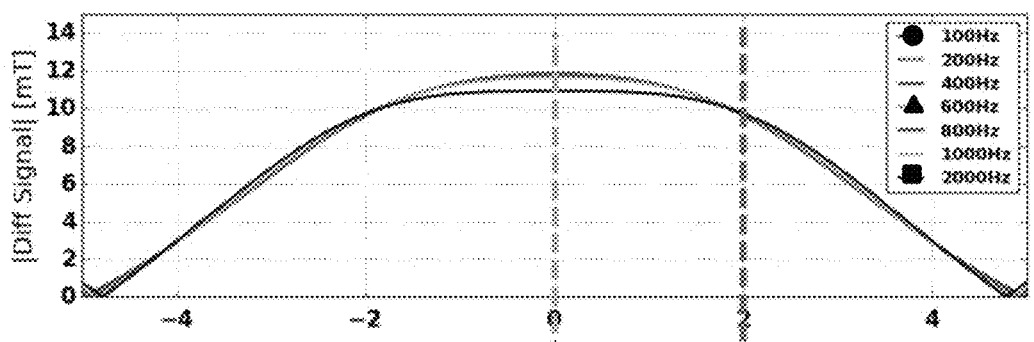
FIG. 12(a) to FIG. 12(c) show plots similar to those of FIG. 2(a) to FIG. 2(c), but for the busbar of FIGS. 11(a) and 11(b), having two slits forming a zigzag.
Figure 12B:
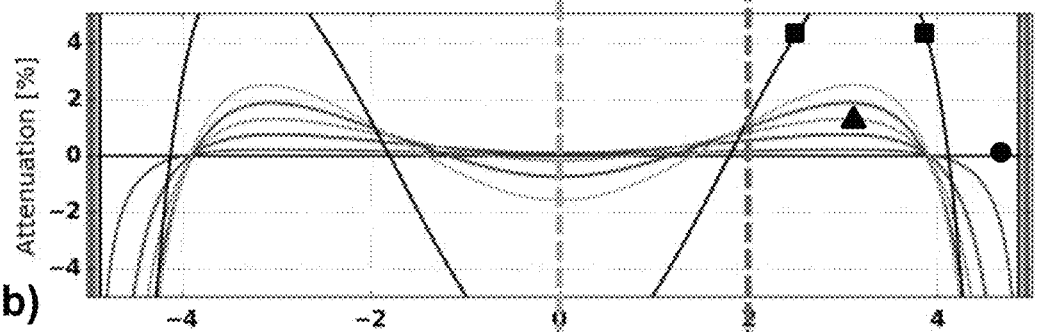
Figure 12C:
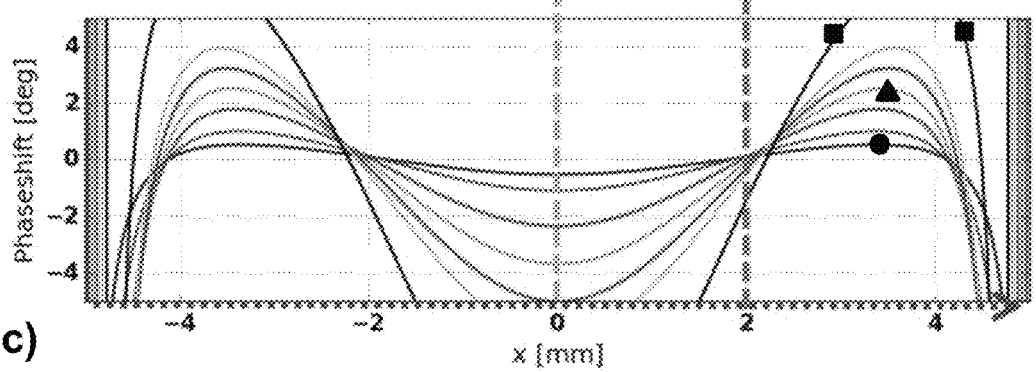

FIG. 12(a) to FIG. 12(c) show simulation results similar to those of FIG. 2(a) to FIG. 2(c), but for the busbar of FIGS. 11(a) and 11(b), having two slits forming a zigzag.

Figure 13:
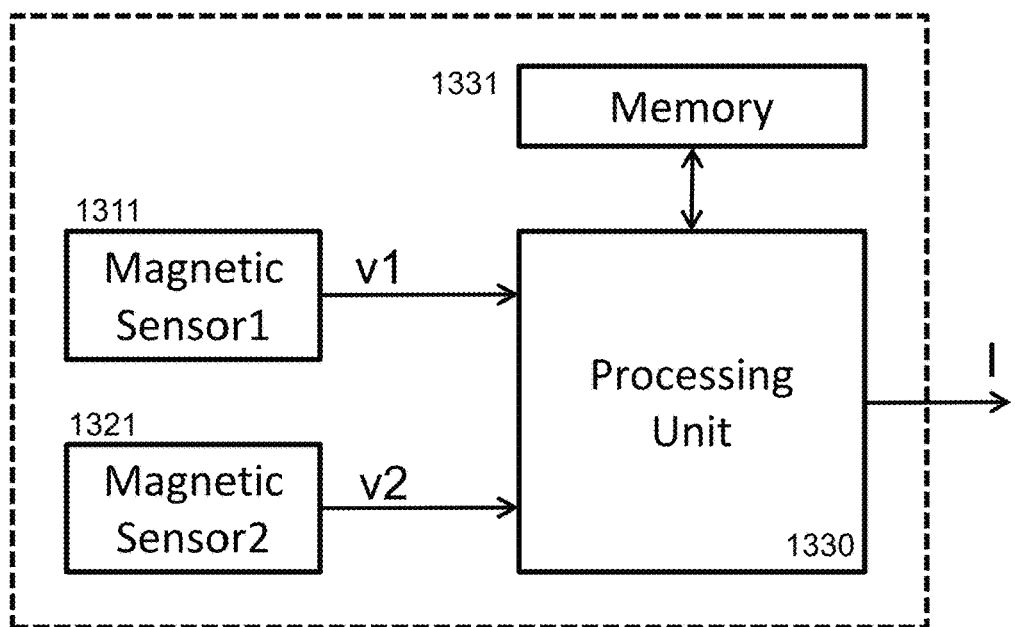
FIG. 13 shows an exemplary block-diagram of an electrical circuit which can be used in embodiments of the present invention.

FIG. 13 shows an electrical block-diagram of a circuit 1310 that can be used in a current sensor device 202. This block-diagram does not contain a temperature sensor or a stress sensor.

The processing unit 1330 is adapted for determining the current to be measured by calculating the current according to the formula: I=K·(v1−v2), where K is a predefined constant, which may be determined during design, by simulation, or during an evaluation or calibration phase), v1 is the value provided by the first magnetic sensor 1311 (or a value derived therefrom, e.g. after amplification), and v2 is the value provided by the second magnetic sensor 1321 (or a value derived therefrom). The subtraction may be done in hardware before amplification or after amplification or can be performed in the digital domain. The processing unit

1330 may comprise a digital processor comprising or connected to a non-volatile memory 1331 storing at least one constant value K.

While not explicitly shown, the processing circuit 1310 may comprise a differential amplifier configured for determining and amplifying a difference between the first value v 1 and the second value v2, and for amplifying this difference in the analogue domain. Alternatively, the processing circuit 1310 may comprise an amplifier configured for selectively amplifying the first value v 1 and the second value v2. The sensor device may further comprise an analog-to-digital convertor ADC configured for digitizing these amplified signals. The ADC may be part of a digital processor circuit.

The current to be measured may be provided as an analog output signal proportional to the current, or may be provided as a digital signal indicative of the current to be measured, for example via a digital data interface, for example a serial data bus (e.g. using the I2C protocol, or using RS232 protocol, or any other suitable protocol).

Figure 14:
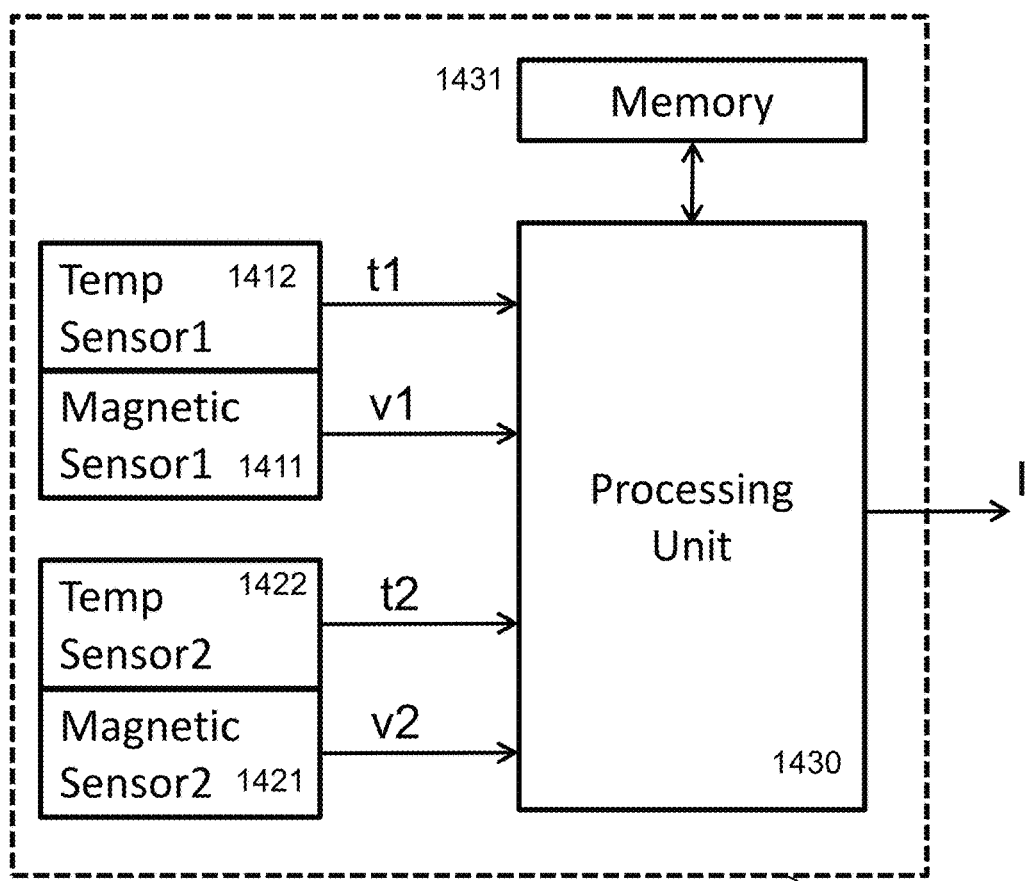
FIG. 14 shows an exemplary block-diagram of an electrical circuit which can be used in embodiments of the present invention.

FIG. 14 shows an electrical block-diagram of a processing circuit 1410 which can be seen as a variant of the processing circuit 1310 of FIG. 13, further comprising a first and/or a second temperature sensor 1412, 1422, communicatively connected to the processing unit 1430. The processing unit 1430 is adapted for determining the current to be measured based on the values v1 and v2 but taking into account one or both of the temperature signals t1, t2. The measured temperature(s) can be taken into account for compensating the measurement values v1, v2 for temperature variations, e.g. to compensate for sensitivity variations of the sensor elements. Such compensation techniques are known per se in the art, and hence need not be explained in more detail here.

In a particular embodiment, a temperature compensation is performed in a manner similar as described in EP3109658A1, which is incorporated herein by reference in its entirety.

It is an advantage of a current sensor that includes a temperature compensation mechanism. In this way, the accuracy of the current measurement can be further improved.

The processing unit 1330 of FIG. 13 and 1430 of FIG. 14 may contain a digital processor, for example a programmable microcontroller. Although not explicitly shown, the circuit 1310 and 1410 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 13 and FIG. 14 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 1430 may contain at least one ADC to convert these signals into digital signals, whereas in case the signals v1, v2, t1 and t2 are digital signals, the processing unit 1430 need not have an ADC.

It is an advantage of embodiments with two temperature sensors, one for each magnetic sensor, because the temperature of the first and second magnetic sensor may be substantially different, especially if a relatively high current is being measured in close vicinity of the busbar, because such a high current typically causes the busbar to warm up significantly, causing a relatively large temperature gradient over the substrate of the sensor device. In this way the accuracy of the current measurement can be further improved.

In a variant (not shown) of FIG. 14, the circuit comprises only one temperature sensor, which may be arranged for measuring the temperature of the first magnetic sensor, or for measuring the temperature of the second magnetic sensor. The temperature of the other magnetic sensor may then be estimated based on the estimated power dissipation (in turn based on v1 and v2) and based on a predefined assumption of the ambient temperature, instead of actually measuring the other temperature. Of course, an embodiment with two temperature sensors is more accurate.

In a variant (not shown) of FIG. 14, the circuit comprises one or two mechanical stress sensors instead of one or two temperature sensors, and the processing unit 1430 is adapted for determining the current based on the values obtained from the magnetic sensors, taking into account the stress value(s) obtained from one or both stress sensors.

In another variant (not shown) of FIG. 14, the circuit additionally comprises one or two stress sensors in addition to one or two temperature sensors, and the processing unit 1430 is adapted for determining the current based on the values obtained from the magnetic sensors and the one or more temperature sensors and the one or more stress sensors.

In an embodiment, each magnetic sensor element H1, H2 has an associated temperature sensor and an associated mechanical stress sensor, and the processing circuit is configured for measuring the two magnetic signals, and for measuring the two temperatures, and for measuring the two mechanical stress values, and is configured for determining $\Delta Bz = Bz1 - Bz2$, and for multiplying the value $\Delta Bz$ by a predefined constant factor K (independent of frequency), and for compensating the result for temperature and/or mechanical stress, for example using a polynomial expression of the temperature and/or stress, for example in a manner as described in EP3109658(A1), incorporated herein by reference in its entirety.

In another embodiment, the sensor device comprises: a semiconductor substrate comprising a first and second magnetic sensor element H1, H2; a first and second biasing means (e.g. a first current source and a second current source) for biasing the first and second magnetic sensor element, one or both of which be may be adjustable or configurable; a first and a second amplifier for amplifying the signals provided by the first and second magnetic sensor element (one or both of the amplifiers may have a configurable or adjustable gain); an analog-to-digital convertor (ADC) for digitizing the first and second sensor signal or a signal derived therefrom; and a processing circuit having an input connected to an output of the ADC. This sensor device further comprises at least one of: (i) a temperature sensor (e.g. a single temperature sensor) for measuring a temperature of the semiconductor substrate, and (ii) two mechanical stress sensors, or a differential stress sensor for measuring a differential stress exerted upon the first and second magnetic sensor. Various examples of hardware block-diagrams are shown in FIG. 3(*a*) to FIG. 5(*f*) of co-pending patent application EP20165059.5 filed on 23 Mar. 2020, and in co-pending patent application EP21161150.4 filed on 7 Mar. 2021 by the same applicant, both applications being incorporated herein by reference in their entirety. By combining the hardware and the biasing or correction methods described in EP20165059.5 or EP21161150.4 with the positioning of the sensor device relative to the busbar in one of the "sweet zones" or "regions" as described above, a current sensor system is provided for measuring an AC current, with high accuracy, and with a reduced influence of a strayfield.

According to another aspect, another solution to the problem of accurately measuring an AC current flowing through a busbar will be described next, with reference to FIG. 15(a) to FIG. 21.

Figure 15A:
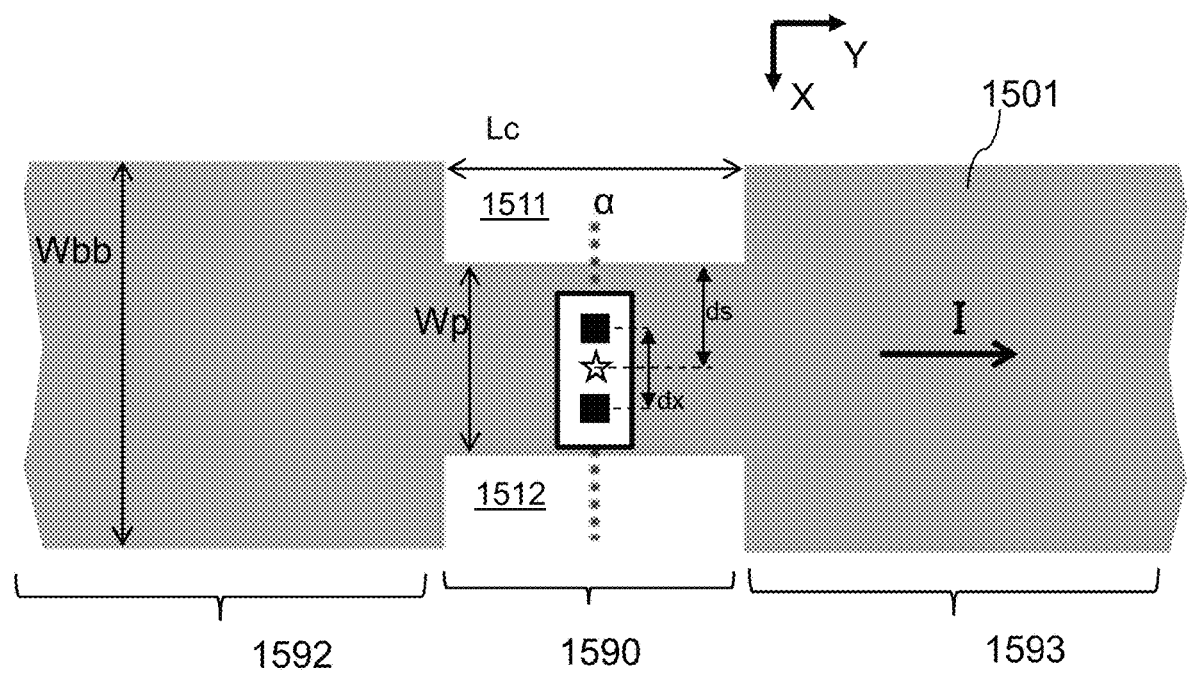
FIG. 15(a) shows a top view.
Figure 15B:
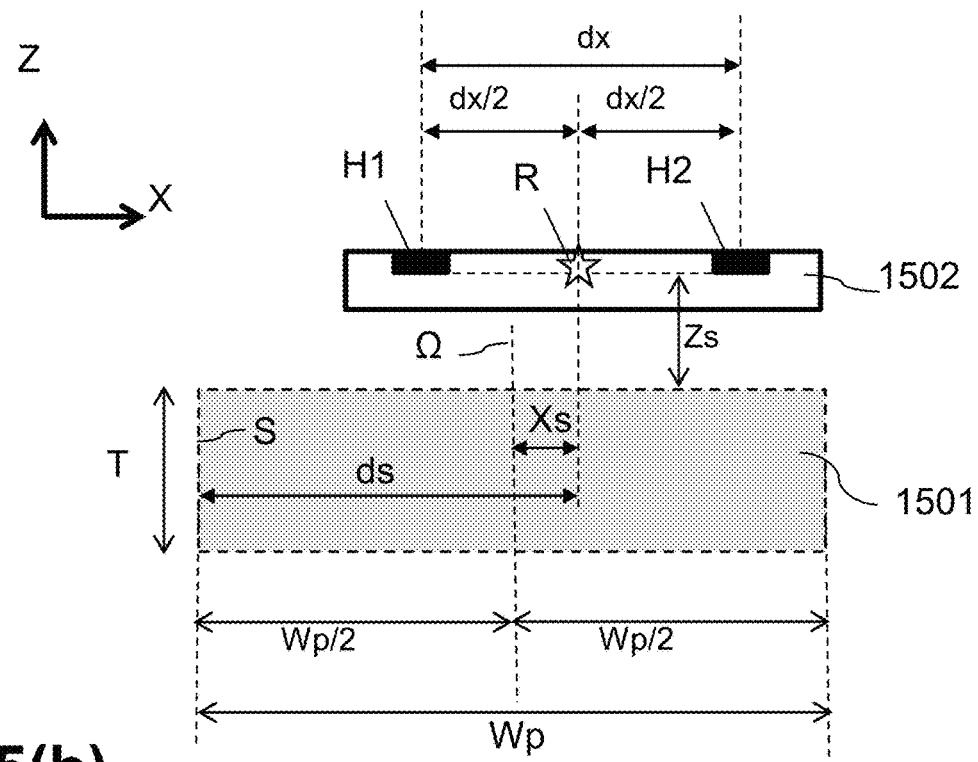
FIG. 15(b) shows an enlarged cross-sectional view of another current sensor system according to an embodiment of the present invention, wherein the busbar comprises a beam shaped portion having a reduced width. The width of the busbar changes abruptly.

FIG. 15(a) shows a current sensor system 1500 in top view, and FIG. 15(b) shows the current sensor system in cross-sectional view in a plane α. The current sensor system 1500 comprises a busbar 1501 and a current sensor device 1502. The busbar has a rectangular cross-section (in the transversal plane α), and having two cut-outs 1511, 1512, e.g. two rectangular cut-outs (seen from above), situated on opposite sides of the busbar. The current sensor device 1502 is fixedly mounted relative to the busbar and is configured for measuring a magnetic field difference ΔBz or a magnetic field gradient dBz/dx of a magnetic field component Bz oriented in the Z-direction along the transversal X direction. The inventors surprisingly found that such a current sensor system 1500 can be highly insensitive to the AC-frequency of the current to be measured, under certain conditions.

More specifically, it was found that a busbar 1501 having a beam shaped portion 1590 with a relatively narrow width Wp in the order of about 2 to 4 mm, optionally situated between a second busbar portion 1592 and a third busbar portion 1593 both having a larger width Wbb (e.g. from 10 mm to 30 mm, e.g. equal to about 15 mm), is also capable of measuring the AC current with high accuracy, but only if the beam shaped portion 1590 has a length Lc of at least 4 mm (e.g. from 4.0 mm to 15 mm), and only if the sensor device is mounted at a certain height Zs (as will be described further).

Figure 19:
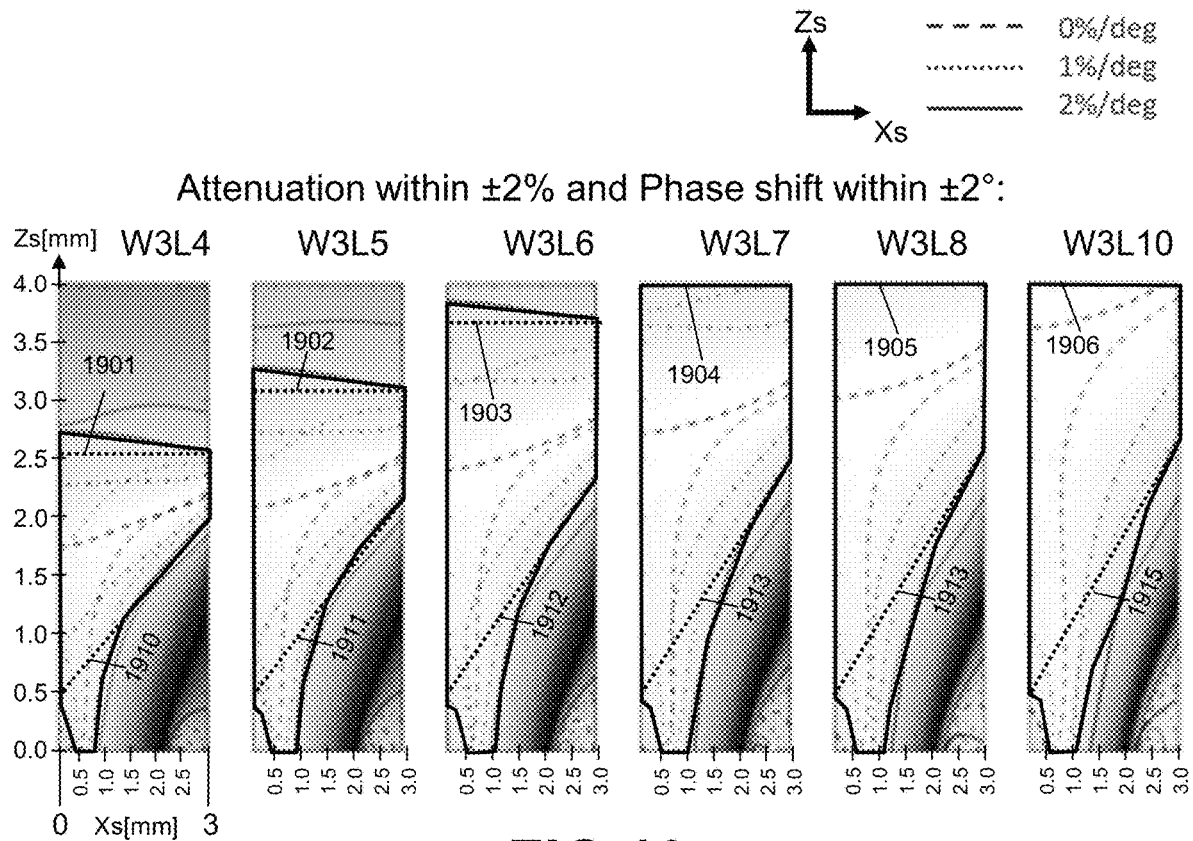
FIG. 19 shows the set of graphs of FIG. 17(a) overlaid with those of FIG. 17(b) in a semi-transparent manner. Regions where the attenuation is smaller than ±2% and the phase shift is smaller than ±2° are indicated.
Figure 20:
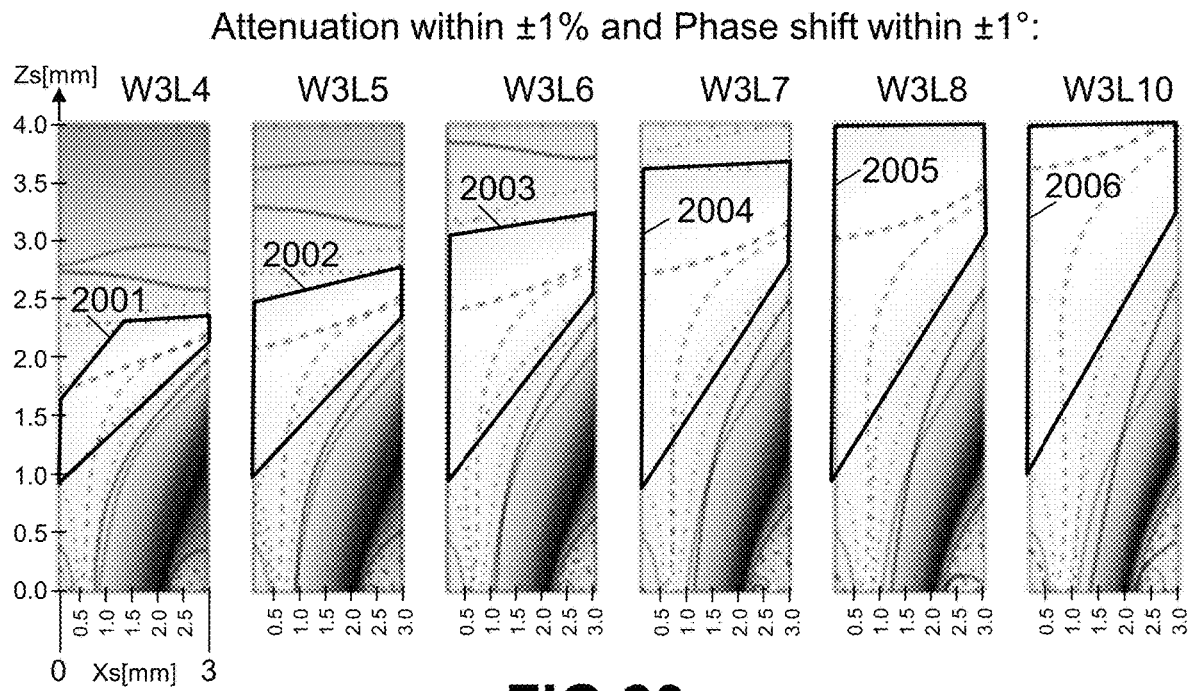
FIG. 20 shows the set of graphs of FIG. 17(a) overlaid with those of FIG. 17(b) in a semi-transparent manner. Regions where the attenuation is smaller than ±1% and the phase shift is smaller than ±1° are indicated.

They furthermore found that ΔBz being largely independent of the AC frequency is not obtained, or to a much lower degree, in case the length Lc of the busbar portion 1590 is too small (e.g. ≤3 mm), and/or when the sensor device is mounted too close to or too far from the busbar (e.g. Wp=3 mm, Lc=4 mm and Zs≥3 mm, as will become clear when discussing FIG. 19).

The present invention proposes a current sensor system 1500; 1600 for measuring an AC electrical current, the system comprising: a busbar 1501, 1601 and a sensor device 1502, 1602 mounted relative to the busbar. The busbar 1501, 1601 comprises a beam shaped portion 1590; 1690 having a predefined length Lc extending in a first direction Y, also referred to as the "longitudinal direction" of the busbar. The first direction is the direction in which the current mainly flows. The beam shaped portion 1590, 1690 has a predefined thickness T in a second direction Z (also referred to herein as "height direction" or "thickness direction") and has a predefined width Wp in a third direction X (also referred to herein as "width direction" or "transversal direction"). The first, second and third direction Y,Z,X are perpendicular to each other. The sensor device 1502, 1602 comprises two sensor elements H1, H2 (e.g. two horizontal Hall elements), spaced apart by a predefined distance "dx" along the transversal direction X. The first sensor element H1 is configured for measuring a first magnetic field component Bz1 oriented in the second direction Z at a first sensor location, and the second sensor element H2 is configured for measuring a second magnetic field component Bz2 oriented in the second direction Z at a second sensor location, situated at a distance dx from the first sensor location. The sensor device 1502, 1602 is further configured for determining a difference ΔBz between these magnetic field components Bz1, Bz2 (or a "magnetic field gradient (dBz/dx) of Bz along the third direction X") and for determining said AC current based on said difference ΔBz, e.g. as a value proportional to this difference, e.g. in accordance with the formula: I=K*ΔBz, where K is a predefined constant, which may depend on temperature, but is independent of the frequency of the current, and ΔBz is (Bz1−Bz2).

Figure 16:
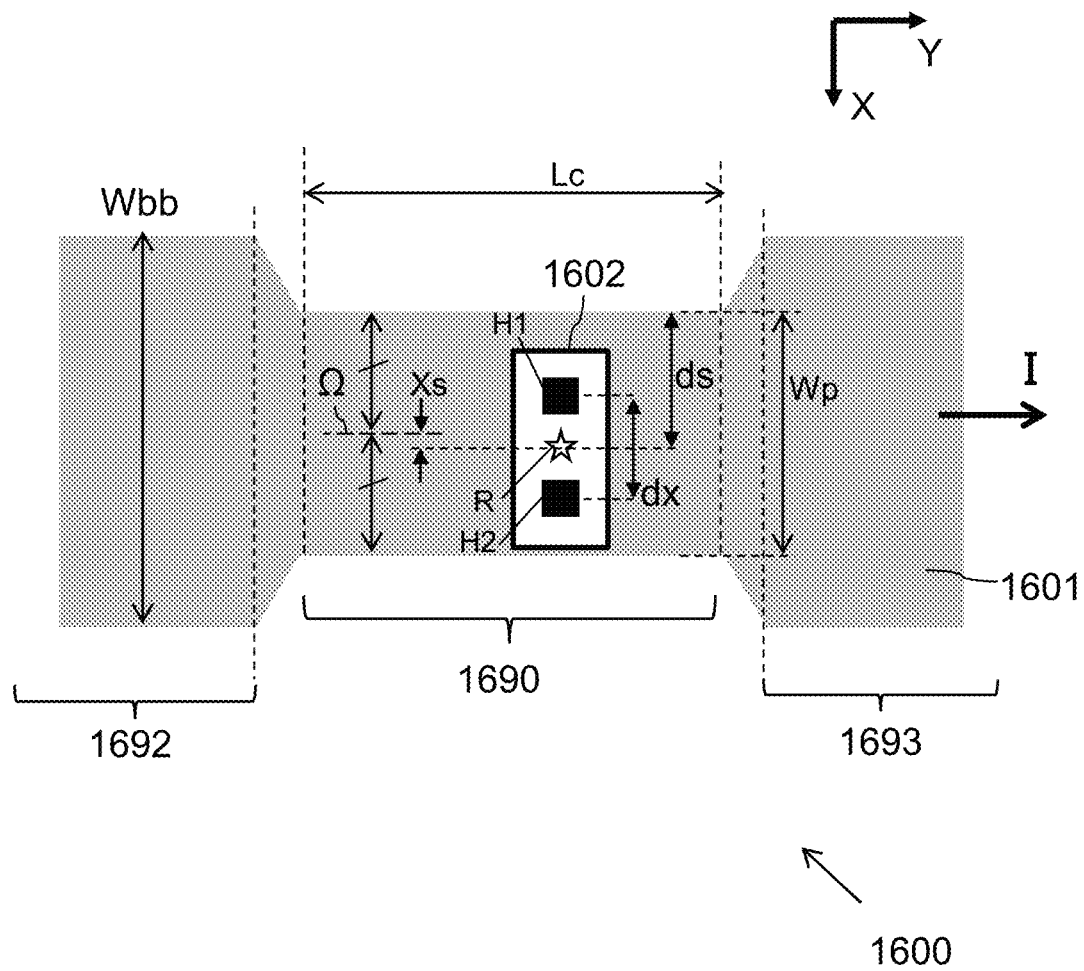
FIG. 16 shows a variant of the sensor system of FIG. 15(a), wherein the width changes gradually.

The sensor device 1502, 1602 is positioned relative to the busbar such that a reference point R of the sensor device, situated in the middle between the two sensor elements H1, H2 is located at a first distance Xs from a symmetry plane Ω (see FIG. 15(b) or FIG. 16) of the beam shaped portion measured in the third or transverse direction X, and is located at a second distance Zs from the beam shaped portion measured in the second or height direction Z. The predefined width Wp of the beam shaped portion is 2.0 to 4.0 mm (or 2.5 to 3.5 mm), and the predefined length Lc of the beam shaped portion is at least 4.0 mm (or at least 5 mm, or at least 6 mm). The predefined distance "dx" between the two sensor elements is a value in the range from 1.0 to 3.0 mm (or from 1.25 to 2.75 mm, or from 1.5 to 2.5 mm). The second distance Zs is a value in the range from 0.5 mm to 4.0 mm, and the first distance Xs is a value in the range from 0.0 mm to 3.0 mm.

Thus, the invention involves dimensions of the busbar, a sensor device for measuring ΔBz, and a specific location of the sensor device relative to the busbar.

As far as is known to the inventors, a current sensor system with the above features is not known, nor is it know that such a current sensor system is capable of measuring an AC current with high accuracy, in particular, is capable of measuring a current having a frequency in the range from 100 Hz to 2000 Hz, with an attenuation smaller than ±2% and/or a phase shift smaller than ±2°, or even with an attenuation smaller than ±1% and/or a phase shift smaller than ±1°, or with an attenuation close to 0%.

It is noted that a busbar having a beam shaped portion with a length Lc from at least 4.0 mm or at least 5.0 mm to about 10 mm, and a width Wp from 2.0 mm to 4.0 mm, and optionally with a thickness in the range from 2.0 mm to 3.0 mm, hence with a cross section in the range from 4 to 12 mm$^2$ is far from a trivial busbar geometry for use in electrical vehicles, where the busbar need to be able to conduct currents of at least 100 Amps in a safe manner. Even when the busbar is made of copper, such a beam shaped portion will generate a considerable amount of heat. A skilled person will not normally choose such a cross section unless there is a very good reason to do so: it allows the AC current to be measured with high accuracy.

Referring now to the Figures.

FIG. 15(a) shows a top view, and FIG. 15(b) shows an enlarged cross-sectional view of such a current sensor system 1500, 1600 in a transversal plane α. The busbar 1501 comprises a beam shaped portion 1590 having a length Lc and width Wp. This beam shaped portion may be situated between a second busbar portion 1592 and a third busbar portion 1593, both having a width Wbb equal to or larger than Wp, e.g. at least 2 mm larger, or at least 4 mm larger, or at least 6 mm larger. As can be seen, the width of the busbar 1501 of FIG. 15(a) changes abruptly along the longitudinal direction Y.

FIG. 16 shows a sensor system 1600 which is a variant of the sensor system 1500 of FIG. 15(a), wherein the width of the busbar changes gradually in a first transition zone situated between the beam shaped portion 1690 and the second portion 1692 as well as in a second transition zone situated between the beam shaped portion 1690 and the third portion 1693, for example linearly. It was found that the shape of the transition is not critical for the invention to work.

The sensor devices 1502, 1602 of the current sensor systems 1500, 1600 shown in FIG. 15(*a*) to FIG. 16 are shown slightly offset with respect to a symmetry plane Ω of the beam shaped portion, in order to define the distance "ds" from a side of the beam shaped portion, and the distance "Xs" from said symmetry plane Ω. In case the distance Xs is equal to 0 mm, or ds=Wp/2, the reference point R of the sensor device is situated in the symmetry plane Ω.

Figure 17A:
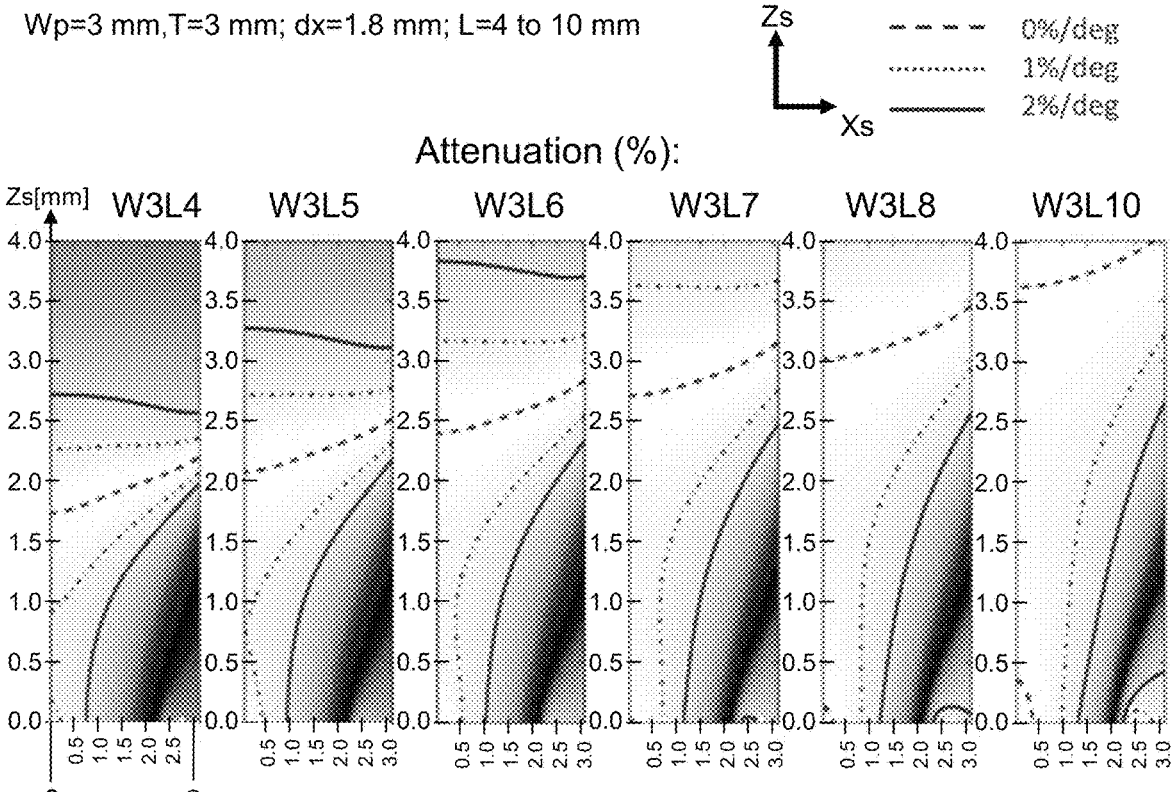
FIG. 17(a) show a set of graphs illustrating attenuation variations (in %), and FIG. 17(b) show a set of graphs, illustrating phase shift variations (in °) of the magnetic field difference ΔBz (or gradient dBz/dx) for various positions (Xs, Zs) of the sensor device relative to the busbar, for a busbar having a beam shaped portion having a width Wp of 3 mm, a length Lc from 4 mm to 10 mm, and a thickness T of 3 mm.
Figure 17B:
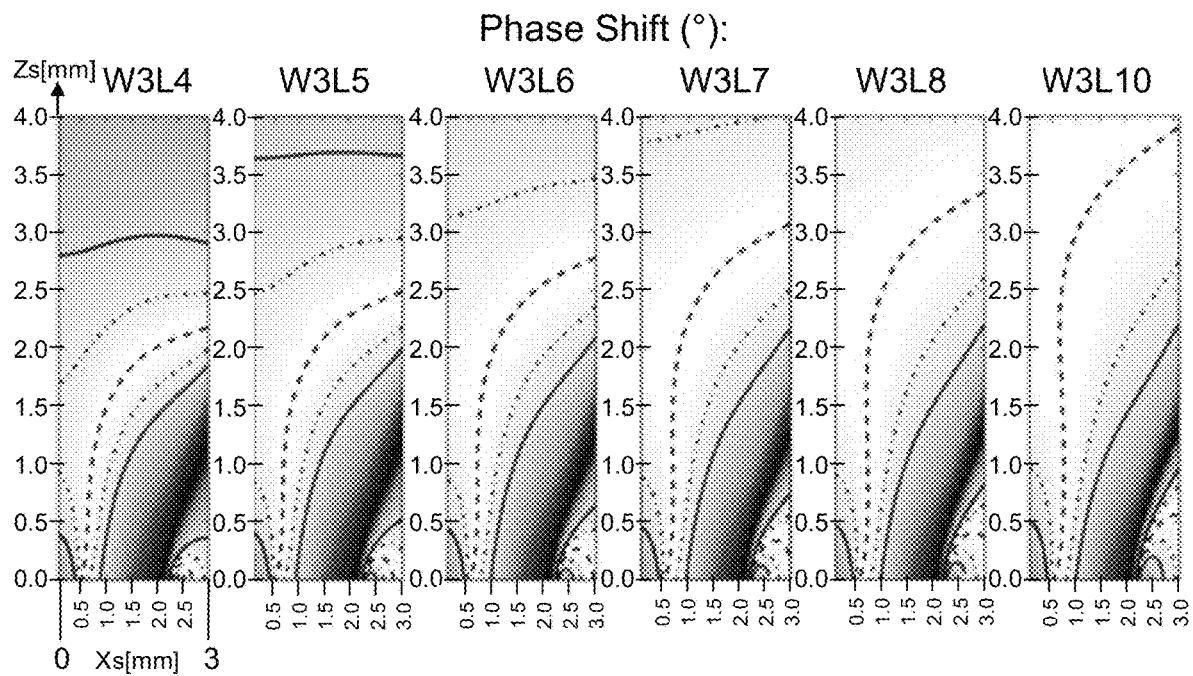

The inventors performed a relatively large set of simulations. FIG. 17(*a*) shows a set of graphs illustrating attenuation variations (in %), and FIG. 17(*b*) shows a set of graphs, illustrating phase shift variations (in °) of the magnetic field difference ΔBz (or gradient dBz/dx) for various positions (Xs, Zs) of the sensor device relative to the busbar, or more specifically, as a function of the parameters Xs and Zs.

The simulation results are performed for a busbar having a beam shaped portion having a width Wp of 3 mm, a thickness T of 3 mm, and a length Lc ranging from 4 mm to 10 mm. The distance dx between the sensor elements was 1.8 mm, but the present invention is not limited to these specific values. Similar to what was explained in FIG. 4(*a*) to FIG. 4(*e*), the curves in the graphs of FIG. 17(*a*) indicate locations in a cross-sectional plane X-Z where the attenuation of the signal ΔBz for a 2 kHz signal deviates by ±2% (solid curves) or ±1% (dotted curves) or 0% (dashed curve) with respect to that of a 100 Hz signal. Likewise, the curves in the graphs of FIG. 17(*b*) indicate locations in a cross-sectional plane X-Z where the phase shift of the signal ΔBz for a 2 kHz signal deviates by ±2° (solid curves) or ±1° (dotted curves) or 0° (dashed curve) with respect to that of a 100 Hz signal.

The abbreviation W3L4 means that the width Wp of the beam shaped portion is equal to 3 mm, and the length Lc is 4 mm, etc. The attenuation curves for W3L4 of FIG. 17(*a*) illustrate, for example, that the attenuation accuracy is worse than ±2% if the sensor device is located for example at (Xs=0 mm and Zs≥2.8 mm). The phase shift curves for W3L4 of FIG. 17(*b*) illustrate, for example, that the phase shift is worse than ±2° if the sensor device is located at (Xs=0 mm and Zs≤0.4 mm or Zs≥2.8 mm).

Figure 18A:
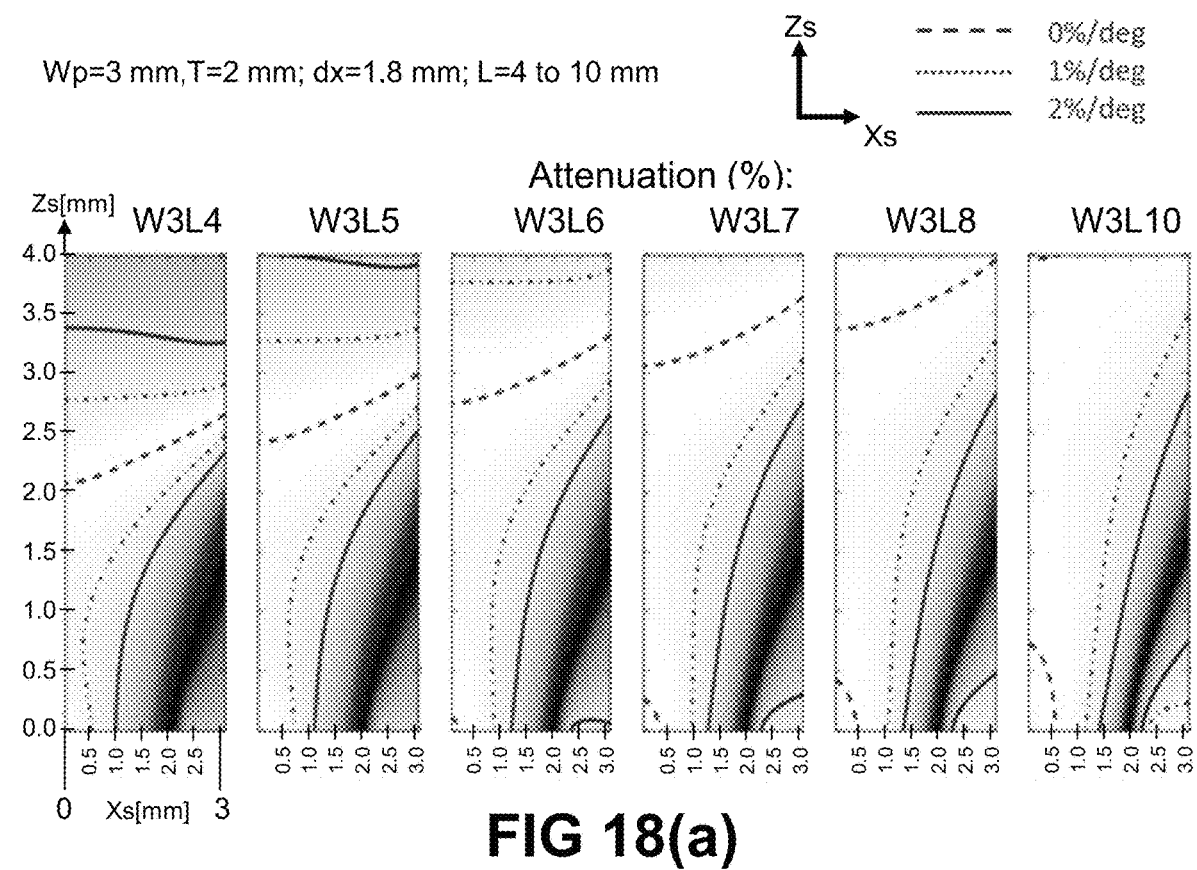
FIG. 18(a) and FIG. 18(b) show a set of graphs similar to those of FIG. 17(a) and FIG. 17(b) for a busbar having a beam shaped portion having a width Wp of 3 mm, a length Lc from 4 mm to 10 mm, and a thickness T of 2 mm.
Figure 18B:
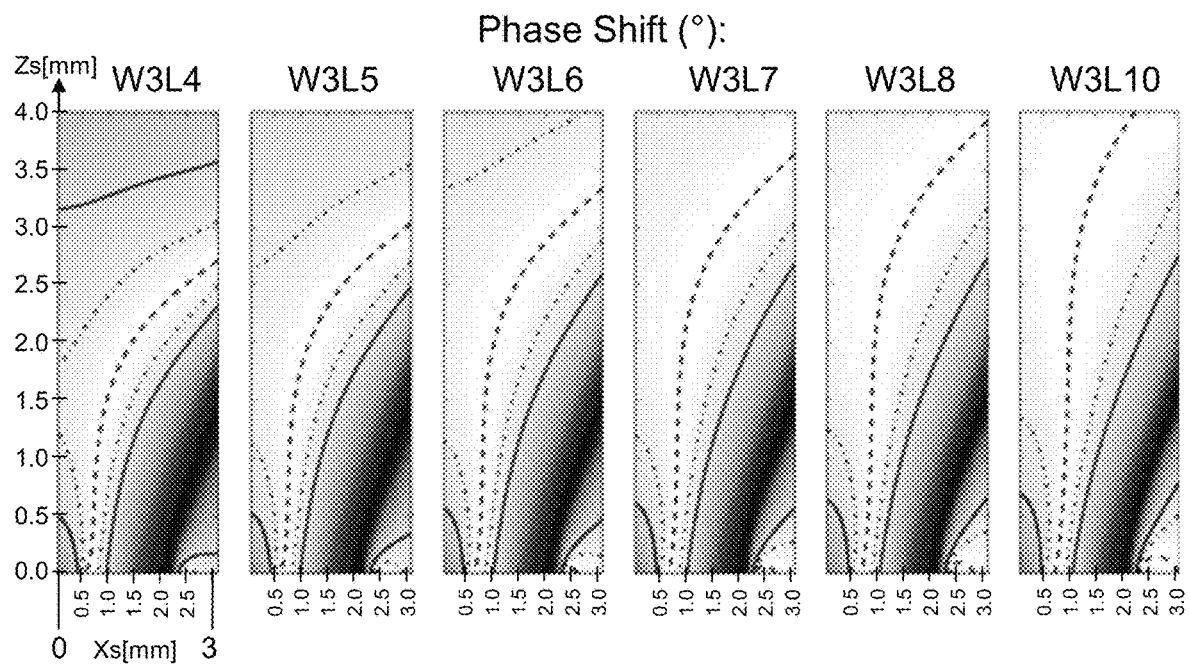

FIG. 18(*a*) and FIG. 18(*b*) show a set of graphs obtained by simulation, similar to those of FIG. 17(*a*) and FIG. 17(*b*) for a busbar like to the one shown in FIG. 15(*a*), having a beam shaped portion 1590 having a width Wp of 3 mm, a length Lc ranging from 4 mm to 10 mm, but a thickness T of 2 mm. Comparison of FIG. 17(*a*) and FIG. 18(*a*), and comparison of FIG. 17(*b*) and FIG. 18(*b*) shows that the thickness T does not have a significant influence on the shape and position of the curves.

FIG. 19 shows the set of (attenuation) graphs of FIG. 17(*a*) overlaid with the (phase shift) graphs of FIG. 17(*b*) in a semi-transparent manner. A region in the X-Z plane where both the attenuation is smaller than ±2% and the phase shift is smaller than ±2° are indicated for the different cases. These regions have a "funnel-like shape" indicated in a bold black curve, but such a shape is not very easy to describe. However, a portion of this region defined by a polygon having four sides (a quadrilateral shape), situated below a horizontal line 1901 to 1906 at the top, and above a sloped line 1910 to 1915 at the bottom, inside which region the attenuation is within ±2% and the phase shift is within ±2°, can be defined by the following set of formulas, further referred to as "SET19":

$$\begin{cases} 0.0 \leq Xs \leq 3.0 \\ 0.5 \leq Zs \leq 4.0 \\ Zs \leq Zmax1, \text{ wherein } Zmax1 = 0.5 + (Lc/2) \\ Xs \leq Xmax1, \text{ wherein } Xmax1 = (Zs - 0.5)/m, \text{ and } m = 0.4 + (Lc/30) \end{cases}$$

wherein Zs is the second distance, Lc is the length of the beam shaped portion, m is a value indicative of the slope of the lines 1910 to 1915, and wherein Xs, Zs, Lc, Zmax1 and Xmax1 are expressed in millimeters.

FIG. 20 shows again the set of graphs of FIG. 17(*a*) overlaid with those of FIG. 17(*b*) in a semi-transparent manner. Polygonal regions where the attenuation is smaller than ±1% and the phase shift is smaller than ±1° are indicated, and these regions could also be described by a set of formulas similar to SET19.

However, interesting locations are those for which Xs=0 mm. While not 100% corresponding to the line segments shown in FIG. 20, the following set of formulas, further referred to as "SET20" can be used to describe in a relatively simple manner, preferred locations where the attenuation is approximately within ±1% and the phase shift is approximately within ±1°:

$$\begin{cases} Xs = 0.0 \\ 1.0 \leq Zs \leq Lc/2 \end{cases}$$

wherein Zs is the second distance, Lc is the length of the beam shaped portion, and Xs, Zs, Lc are expressed in millimeters.

Figure 21:
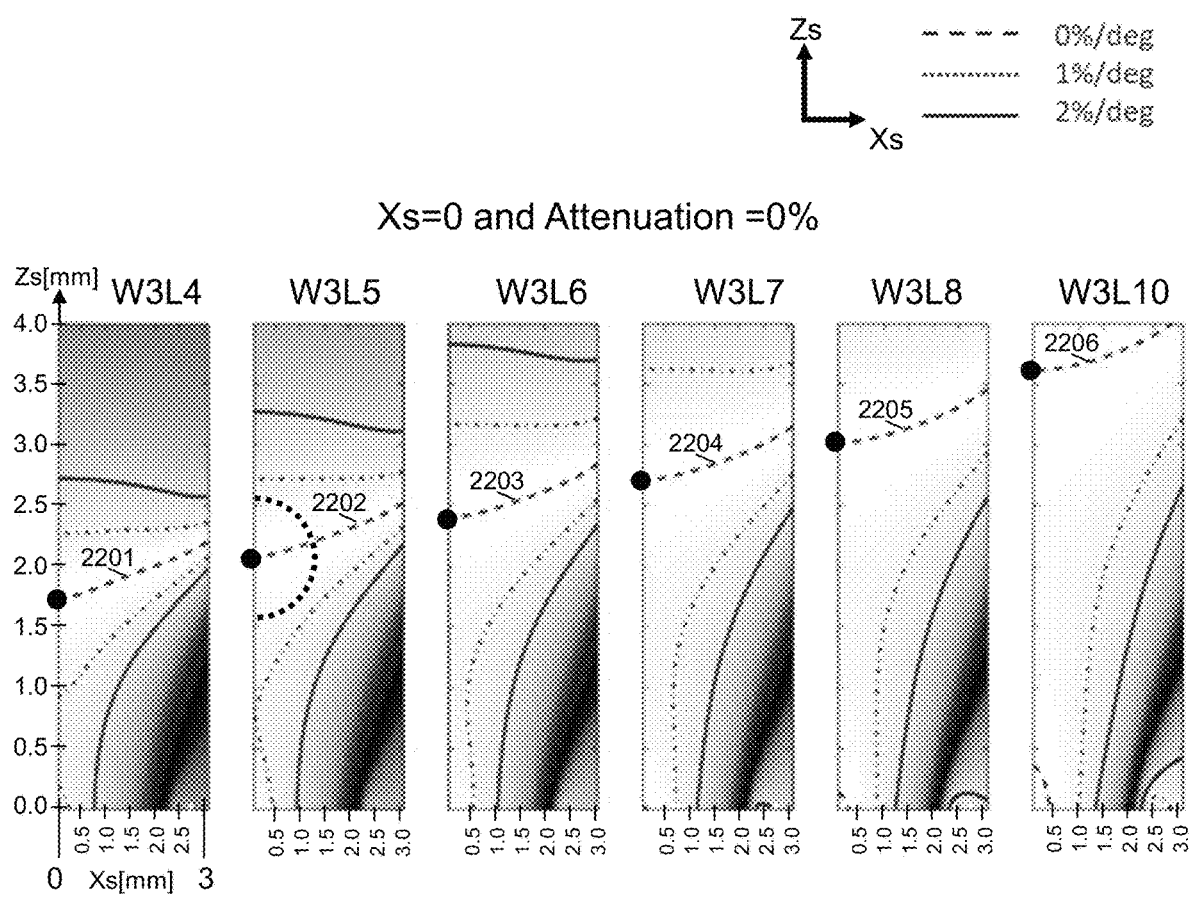
FIG. 21 shows the set of graphs of FIG. 17(a). Each graph shows a curve where the attenuation is equal to 0%. The locations where these curves intersect a symmetry plane of the beam shaped busbar portion is indicated by means of a black circle.

FIG. 21 shows the set of graphs of FIG. 17(*a*). Each graph shows a dashed curve 2201 to 2206 where the attenuation is equal to 0%. The intersection of these curves and the vertical axis where Xs=0, is indicated by means of a black circle. In some embodiments, these locations are also considered as preferred locations for positioning the current sensor device.

These locations can be approximated by the following formulas, further referred to as "SET21":

$$\begin{cases} Xs = 0.0 \\ Zs = 0.5 + (0.3) * Lc \end{cases}$$

wherein Zs is the second distance, Lc is the length of the beam shaped portion, and wherein Xs, Zs, Lc are expressed in millimeters.

In some embodiments of the present invention, the reference point R of the sensor device is situated at or near these locations, e.g. within a radial distance of ±1.0 mm from the point indicated by the black circle, or within a radial distance of ±0.7 mm, or within a radial distance of ±0.5 mm, or within a radial distance of ±0.3 mm, e.g. as illustrated in the graph of W3L5.

In summary, embodiments of the present invention can then be specified by a set of parameters as specified by any of the rows of the following table:

TABLE 6 preferred embodiments of the present invention

| Wp [mm] | dx [mm] | T [mm] | Lc [mm] | Xs and Zs |
|---|---|---|---|---|
| 2.0 to 4.0 | 1.0 to 3.0 | 2.0 to 3.0 | 4.0 to 10.0 | as specified by "SET19" |
| 2.0 to 4.0 | 1.0 to 3.0 | 2.0 to 3.0 | 4.0 to 10.0 | as specified by "SET20" |

TABLE 6-continued preferred embodiments of the present invention

| Wp [mm] | dx [mm] | T [mm] | Lc [mm] | Xs and Zs |
|---|---|---|---|---|
| 2.0 to 4.0 | 1.0 to 3.0 | 2.0 to 3.0 | 4.0 to 10.0 | as specified by "SET21" |
| 2.0 to 4.0 | 1.5 to 2.5 | 2.0 to 3.0 | 4.0 to 10.0 | as specified by "SET19" |
| 2.0 to 4.0 | 1.5 to 2.5 | 2.0 to 3.0 | 4.0 to 10.0 | as specified by "SET20" |
| 2.0 to 4.0 | 1.5 to 2.5 | 2.0 to 3.0 | 4.0 to 10.0 | as specified by "SET21" |
| 2.0 to 4.0 | 1.8 to 2.2 | 2.0 to 3.0 | 4.0 to 10.0 | as specified by "SET19" |
| 2.0 to 4.0 | 1.8 to 2.2 | 2.0 to 3.0 | 4.0 to 10.0 | as specified by "SET20" |
| 2.0 to 4.0 | 1.8 to 2.2 | 2.0 to 3.0 | 4.0 to 10.0 | as specified by "SET21" |
| 2.5 to 3.5 | 1.0 to 3.0 | 2.0 to 3.0 | 4.0 to 10.0 | as specified by "SET19" |
| 2.5 to 3.5 | 1.0 to 3.0 | 2.0 to 3.0 | 4.0 to 10.0 | as specified by "SET20" |
| 2.5 to 3.5 | 1.0 to 3.0 | 2.0 to 3.0 | 4.0 to 10.0 | as specified by "SET21" |
| 2.5 to 3.5 | 1.5 to 2.5 | 2.0 to 3.0 | 4.0 to 10.0 | as specified by "SET19" |
| 2.5 to 3.5 | 1.5 to 2.5 | 2.0 to 3.0 | 4.0 to 10.0 | as specified by "SET20" |
| 2.5 to 3.5 | 1.5 to 2.5 | 2.0 to 3.0 | 4.0 to 10.0 | as specified by "SET21" |
| 2.5 to 3.5 | 1.8 to 2.2 | 2.0 to 3.0 | 4.0 to 10.0 | as specified by "SET19" |
| 2.5 to 3.5 | 1.8 to 2.2 | 2.0 to 3.0 | 4.0 to 10.0 | as specified by "SET20" |
| 2.5 to 3.5 | 1.8 to 2.2 | 2.0 to 3.0 | 4.0 to 10.0 | as specified by "SET21" |

It is noted that the parameters of each row may be further restricted by one or more or all of the following restrictions:
(i) $T \leq Wp$;
(ii) $Wp \geq dx*(0.5)$; or $Wp \geq dx*(0.6)$; or $Wp \geq dx*(0.7)$; or $Wp \geq dx*(0.8)$
(iii) $Wp \leq dx*(2.0)$; or $Wp \leq dx*(1.8)$; or $Wp \leq dx*(1.6)$; or $Wp \leq dx*(1.4)$; or $Wp \leq dx*(1.2)$
(iv) $Lc \geq dx*(2.0)$; or $Lc \geq dx*(2.25)$; or $Lc \geq dx*(2.5)$; or $Lc \geq dx*(2.75)$; or $Lc \geq dx*(3.0)$;
(v) $Zs \geq dx/2$; or $Zs \geq dx*(0.6)$; or $Zs \geq dx*(0.7)$; or $Zs \geq dx*(0.8)$; or $Zs \geq dx*(0.9)$; or $Zs \geq dx$
(vi) $Xs \leq dx*(2.0)$; or $Xs \leq dx*(1.5)$; or $Xs \leq dx$; or $Xs \leq dx*(0.5)$; or $Xs \leq dx*(0.25)$
(vii) $Zs \geq 1.5$ mm; or $Zs \geq 2.0$ mm
(viii) $Wp \geq 2.6$ mm and $Wp \leq 3.4$ mm
(ix) $Lc \leq 10.0$ mm; or $Lc \leq 8.0$ mm; or $Lc \leq 6.0$ mm In addition, the width Wbb of the second and third conductor portions 1592, 1593, 1692, 1693, may be at least 20% larger than the width Wp of the beam shaped conductor portion 1590, 1690, or expressed mathematically: $Wbb \geq Wp*(1.2)$; or $Wbb \geq Wp*(1.4)$; or $Wbb \geq Wp*(1.6)$; or $Wbb \geq Wp*(1.8)$; or $Wbb \geq Wp*2$.

In preferred embodiments, the sensor system 1500, 1600 has the following combination of parameters: $T \leq Wp$; and $Wp \geq dx$; and $Wp \leq dx*2$; and $Lc \geq 2*dx$; and $Lc \geq Wp$; and $Zs \geq dx/2$; and $Xs \leq dx$; and $Wbb \geq Wp*(1.2)$.

The invention claimed is:

1. A current sensor system for measuring an AC electrical current, comprising:
    a busbar comprising a beam shaped portion having a predefined length (Lc) extending in a first direction (Y), and a predefined thickness (T) in a second direction (Z), and a predefined width (Wp) in a third direction (X) perpendicular to the first direction (Y);
    a sensor device comprising two sensor elements spaced apart by a predefined distance (dx) along the third direction (X), each sensor element being configured for measuring a magnetic field component oriented in the second direction;
    the sensor device being configured for determining a difference between these magnetic field components, and for determining said AC current based on said difference;
    wherein the sensor device is positioned relative to the busbar such that a reference point (R) of the sensor device situated in the middle between the two sensor elements is located at a first distance (Xs) measured in the third direction (X) from a symmetry plane (Q) of the beam shaped portion, and is located at a second distance (Zs) from the busbar measured in the second direction (Z);
    wherein the predefined width (Wp) of the beam shaped portion is 2.0 to 4.0 mm; and
    wherein the predefined length (Lc) of the beam shaped portion is at least 4.0 mm; and
    wherein the predefined distance (dx) between the two sensor elements is a value in the range from 1.0 to 3.0 mm; and
    wherein the second distance (Zs) is a value in the range from 0.5 mm to 4.0 mm; and
    wherein the first distance (Xs) is a value in the range from 0.0 mm to 3.0 mm.

2. The current sensor system according to claim 1, wherein the second distance (Zs) is smaller than 4.0 mm and is smaller than a value Zmax1 defined by the following formula: $Zmax1 = 0.5 + (Lc/2)$, wherein Lc is the length of the beam shaped portion, and wherein Zs, Zmax1 and Lc are expressed in millimeters.

3. The current sensor system according to claim 1, wherein the first distance (Xs) is smaller than 3.0 mm and is smaller than a value Xmax1 defined by the following formula: $Xmax1 = (Zs - 0.5)/M$; wherein Zs is the second distance of at least 0.5 mm, and Lc is the length of the beam shaped portion, and M is expressed by the following formula: $M = 0.40 + (Lc/30)$; and wherein Xs, Zs, Lc and Xmax1 are expressed in millimeters.

4. The current sensor system according to claim 1, wherein the first distance (Xs) is equal to 0 mm.

5. A current sensor system according to claim 4, wherein the second distance (Zs) is at least 1.0 mm; and wherein the second distance (Zs) is a value smaller than Lc/2, wherein Lc is the length of the beam shaped portion; and wherein the value of Xs, Zs, and Lc are expressed in millimeter.

6. The current sensor system according to claim 4, wherein the second distance (Zs) is a value in the range from $Zza - 1.0$ mm to $Zza + 1$ mm, wherein Zza is expressed by the following formula: $Zza = (0.5) + (0.3)*Lc$, wherein Lc is the length of the beam shaped portion, and wherein Zza and Lc are expressed in mm.

7. The current sensor system according to claim 6, wherein the second distance (Zs) is a value in the range from the value $Zza - 0.5$ mm to $Zza + 0.5$ mm.

8. The current sensor system according to claim 1, wherein the beam shaped portion has a thickness (T) in the range from 2.0 to 3.0 mm.

9. The current sensor system according to claim 1, wherein the beam shaped portion of the busbar has a width (Wp) in the range from 2.2 to 3.8 mm.

10. The current sensor system according to claim 1, wherein the two sensor elements are two horizontal Hall elements.

11. The current sensor system according to claim 1, wherein the two sensor elements are spaced apart by a distance (dx) in the range from 1.25 mm to 2.75 mm, or by a value in the range from 1.5 mm to 2.5 mm.

12. The current sensor system according to claim 1, wherein the sensor device comprises a semiconductor substrate; and wherein the semiconductor substrate has an active surface comprising said two magnetic sensor elements; and wherein the semiconductor substrate is oriented such that its active surface is facing away from the busbar; and wherein the sensor device is mounted on a printed circuit board, such that the printed circuit board is situated between the beam shaped portion and the sensor device.

13. The current sensor system according to claim 1, wherein the beam shaped portion of the busbar is situated between a second portion and a third portion of the busbar, the second portion having a second width (Wbb), the third portion having a width equal to the second width (Wbb); and wherein a ratio of the second width (Wbb) and the width (Wp) of the beam shaped portion is at least 120%.

14. The current sensor system according to claim 1, wherein a ratio of the length (Lc) of the beam shaped portion and the distance (dx) between the two sensor elements is at least 200%.

15. The current sensor system according to claim 1, wherein one or more or all of the following conditions are satisfied:
  i) wherein a ratio of the thickness (T) and the width (Wp) of the beam shaped portion is at most 100%;
  ii) wherein a ratio of the width (Wp) of the beam shaped portion and the distance (dx) between the two sensor elements is at least 50%;
  iii) wherein a ratio of the width (Wp) of the beam shaped portion and the distance (dx) between the two sensor elements is at most 200%;
  iv) wherein a ratio of the second distance (Zs) and the distance (dx) between the two sensor elements is at least 50%;
  v) wherein a ratio of the second distance (Zs) and the distance (dx) between the two sensor elements is at most 200%;
  vi) wherein a ratio of the first distance (Xs) and the distance (dx) between the two sensor elements is at most 200%, or at most 100%, or at most 50%.

16. A current sensor system for measuring an AC electrical current, comprising:

a busbar comprising a beam shaped portion having a predefined length (Lc) extending in a first direction (Y), and a predefined thickness (T) in a second direction (Z), and a predefined width (Wp) in a third direction (X) perpendicular to the first direction (Y);

a sensor device comprising two sensor elements spaced apart by a predefined distance (dx) along the third direction (X), each sensor element being configured for measuring a magnetic field component oriented in the second direction (Z);

the sensor device being configured for determining a difference between these magnetic field components, and for determining said AC current based on said difference;

wherein the sensor device is positioned relative to the busbar such that a reference point of the sensor device situated in the middle between the two sensor elements is located at a first distance (Xs) measured in the third direction (X) from a symmetry plane (Q) of the beam shaped portion, and is located at a second distance (Zs) from the busbar measured in the second direction (Z); and wherein the width (Wp) of the beam shaped portion is 50% to 200% of the distance (dx) between the sensor elements; and wherein the length (Lc) of the beam shaped portion is at least 200% of the distance (dx) between the sensor elements; and wherein the second distance (Zs) is at least 50% of the distance (dx) between the sensor elements; and wherein the first distance (Xs) is at most 200% of the distance (dx) between the sensor elements.

17. The current sensor system according to claim 16, wherein the beam shaped portion is situated between a second busbar portion and a third busbar portion; and wherein each of the second and third busbar portion has a width of at least 200% of the width of the beam shaped portion.

18. The current sensor system according to claim 16, wherein one or more or all of the following conditions are satisfied:
  i) the second distance (Zs) is at least 1.5 mm;
  ii) the distance (dx) between the sensor elements is 1.8 to 2.2 mm;
  iii) the width (Wp) of the beam shaped portion is a value in the range from 2.6 to 3.4 mm;
  iv) the two sensor elements are two horizontal Hall elements.

19. A current sensor system for measuring an AC electrical current, comprising:

a busbar comprising a beam shaped portion having a predefined length (Lc) extending in a first direction (Y), and a predefined thickness (T) in a second direction (Z), and a predefined width (Wp) in a third direction (X) perpendicular to the first direction (Y);

a sensor device comprising two sensor elements spaced apart by a predefined distance (dx) along the third direction (X), each sensor element being configured for measuring a magnetic field component oriented in the second direction;

the sensor device being configured for determining a difference between these magnetic field components, and for determining said AC current based on said difference;

wherein the sensor device is positioned relative to the busbar such that a reference point of the sensor device situated in the middle between the two sensor elements is located at a first distance (Xs) measured in the third direction (X) from a symmetry plane (Q) of the beam shaped portion, and is located at a second distance (Zs) from the busbar measured in the second direction (Z); and wherein a ratio (T/Wp) of the thickness (T) and the width (Wp) of the beam shaped portion is at most 100%; and wherein a ratio (Wp/dx) of the width (Wp) of the beam shaped portion and the distance (dx) between the sensor elements is a value in the range from 50% to 200%; and wherein a ratio (Lc/Wp) of the length (Lc) and the width (Wp) of the beam shaped portion is at least 100%; and wherein a ratio (Zs/dx) of the second distance (Zs) and the distance (dx) between the sensor elements is a value in the range from 50% to 200%; and wherein a ratio (Xs/dx) of the first distance (Xs) and the distance (dx) between the sensor elements is at most 200%.

20. The current sensor system according to claim 19, wherein the beam shaped portion is situated between a second busbar portion and a third busbar portion; and wherein each of the second and third busbar portion has a width (Wbb) of at least 200% of the width (Wp) of the beam shaped portion.

21. The current sensor system according to claim 19, wherein one or more or all of the following conditions are satisfied:
   i) the second distance (Zs) is at least 1.5 mm;
   ii) the distance (dx) between the sensor elements is 1.8 to 2.2 mm;
   iii) the width (Wp) of the beam shaped portion is a value in the range from 2.6 to 3.4 mm;
   iv) the two sensor elements are two horizontal Hall elements.

* * * * *